US012593520B2

(12) United States Patent
Kim et al.

(10) Patent No.: US 12,593,520 B2
(45) Date of Patent: Mar. 31, 2026

(54) IMAGE SENSOR INCLUDING PIXELS HAVING A PLURALITY OF CAPACITORS

(71) Applicant: Samsung Electronics Co., Ltd., Suwon-si (KR)

(72) Inventors: Juyeong Kim, Suwon-si (KR); Changhyun Park, Suwon-si (KR); Eunsub Shim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 145 days.

(21) Appl. No.: 18/319,612

(22) Filed: May 18, 2023

(65) Prior Publication Data
US 2024/0088176 A1     Mar. 14, 2024

(30) Foreign Application Priority Data
Sep. 14, 2022     (KR) ........................ 10-2022-0115799

(51) Int. Cl.
| | |
|---|---|
| *H10F 39/00* | (2025.01) |
| *H04N 25/57* | (2023.01) |
| *H04N 25/77* | (2023.01) |
| *H04N 25/78* | (2023.01) |
| *H10F 39/18* | (2025.01) |

(52) U.S. Cl.
CPC .......... *H10F 39/803* (2025.01); *H04N 25/57* (2023.01); *H04N 25/77* (2023.01); *H04N 25/78* (2023.01); *H10F 39/18* (2025.01)

(58) Field of Classification Search
CPC ....... H10F 39/803; H10F 39/18; H04N 25/57; H04N 25/77; H04N 25/78; H04N 25/533; H04N 25/583; H04N 25/59; H04N 25/771; H04N 25/76
See application file for complete search history.

(56) References Cited

U.S. PATENT DOCUMENTS

| | | | |
|---|---|---|---|
| 6,888,122 B2 | 5/2005 | Fossum | |
| 9,293,503 B2 | 3/2016 | Sakano et al. | |
| 9,769,406 B2 | 9/2017 | Sakano | |
| 10,154,222 B2 | 12/2018 | Sugawa et al. | |
| 2021/0112212 A1 | 4/2021 | Oh | |
| 2021/0183926 A1 | 6/2021 | Choi et al. | |
| 2021/0274119 A1 | 9/2021 | Nakamura | |
| 2021/0281782 A1* | 9/2021 | Shim ..................... H04N 25/778 |
| 2021/0289154 A1 | 9/2021 | Johnson et al. | |
| 2022/0191418 A1* | 6/2022 | Jung ....................... H04N 25/78 |
| 2022/0350024 A1* | 11/2022 | Isobe ..................... H04N 25/70 |
| 2022/0408038 A1* | 12/2022 | Kim ....................... H04N 25/51 |

* cited by examiner

*Primary Examiner* — Gevell V Selby
(74) *Attorney, Agent, or Firm* — Harness, Dickey & Pierce, P.L.C.

(57) ABSTRACT
An image sensor includes a pixel array in which a plurality of pixels are arranged, wherein each of the pixels includes a photodiode, a transfer transistor, first to third floating diffusion nodes, a first capacitor, a second capacitor, a third capacitor, a first switch transistor, a second switch transistor, and a reset transistor. The second switch transistor is configured to turn off in a first period and to turn on in a second period of an exposure period of the photodiode, and the reset transistor is configured to turn on in the first period and to turn off in the second period of the exposure period of the photodiode.

20 Claims, 11 Drawing Sheets

IMAGE SENSOR INCLUDING PIXELS HAVING A PLURALITY OF CAPACITORS

CROSS-REFERENCE TO RELATED APPLICATION

This application is based on and claims priority under 35 U.S.C. § 119 to Korean Patent Application No. 10-2022-0115799, filed on Sep. 14, 2022, in the Korean Intellectual Property Office, the disclosure of which is incorporated by reference herein in its entirety.

BACKGROUND

Various example embodiments relate to an image sensor, and more particularly, to an image sensor that generates image data using a capacitor connected to a floating diffusion node.

Image sensors are devices that capture a two-dimensional (2D) and/or three-dimensional (3D) image of an object. Image sensors may generate an image of an object using a photoelectric conversion element that reacts according to the intensity of light reflected from the object. With the recent development of complementary metal-oxide semiconductor (CMOS) technology, CMOS image sensors using CMOS have been widely used. Recently, in order to increase a dynamic range (DR) of image sensors, technology of adding a DRAM capacitor to a floating diffusion node (FD) has been developed.

SUMMARY

Various example embodiments provide an image sensor that generates image data having a wide dynamic range (DR) and an improved signal-to-noise ratio (SNR) by using a capacitor connected to a floating diffusion node (FD).

According to various example embodiments, there is provided an image sensor including a pixel array in which a plurality of pixels are arranged. Each of the plurality of pixels includes a photodiode, a transfer transistor connected to the photodiode, first to third floating diffusion nodes configured to accumulate charges generated by the photodiode, a first capacitor connected to the first floating diffusion node, a second capacitor connected to the second floating diffusion node, a third capacitor connected to the third floating diffusion node, a first switch transistor having one end connected to the first floating diffusion node and another end connected to the second floating diffusion node, a second switch transistor having one end connected to the second floating diffusion node and another end connected to the third floating diffusion node, and a reset transistor having one end connected to the third floating diffusion node and another end to which a pixel voltage is configured to be applied. The second switch transistor is configured to turn off in a first period and to turn on in a second period of an exposure period of the photodiode, and the reset transistor is configured to turn on in the first period and to turn off in the second period of the exposure period of the photodiode.

Alternatively or additionally according to various example embodiments, there is provided an image sensor including a pixel array in which a plurality of pixels are arranged, a row driver configured to provide a select signal to the pixel array, and a readout circuit configured to read out pixel signals output from pixels of a row line selected by the row driver. Each of the plurality of pixels includes a photodiode, a transfer transistor connected to the photodiode, first through third floating diffusion nodes accumulating charges generated by the photodiode, a first capacitor connected to the first floating diffusion node and configured to accumulate charges overflowed from the photodiode, a second capacitor connected to the second floating diffusion node, a third capacitor connected to the third floating diffusion node, a first switch transistor having one end connected to the first floating diffusion node, a second switch transistor having one end connected to the third floating diffusion node and another end connected to the third capacitor, a reset transistor having one end connected to the second floating diffusion node and another end to which a pixel voltage is configured to be applied, a source follower transistor having one end connected to the first capacitor and another end to which the pixel voltage is configured to be applied, and a selection transistor having one end connected to the source follower transistor. The second switch transistor is configured to turn off in a first period and to turn on in a second period of an exposure period of the photodiode, and the reset transistor is configured to turn on in the first period and to turn off in the second period of the exposure period of the photodiode.

Alternatively or additionally according to various example embodiments, there is provided an image sensor including a pixel array in which a plurality of pixels are arranged and a readout circuit. Each of the plurality of pixels includes a photodiode, a transfer transistor connected to the photodiode, first to third floating diffusion nodes configured to accumulate charges generated by the photodiode, a first capacitor connected to the first floating diffusion node and configured to accumulate charges overflowed from the photodiode, a second capacitor connected to the second floating diffusion node and configured to accumulate charges overflowed from the photodiode, a third capacitor connected to the third floating diffusion node and configured to accumulate charges overflowed from the photodiode, a first switch transistor having one end connected to the first floating diffusion node and another end connected to the second floating diffusion node, a second switch transistor having one end connected to the second floating diffusion node and another end connected to the third floating diffusion node, and a reset transistor having one end connected to the second floating diffusion node. The first switch transistor is configured to turn off in a first period of a readout period of the photodiode, in which each pixel operates in a high conversion gain (HCG) mode, and to turn on in a second period of the readout period of the photodiode, in which each pixel operates in a low conversion gain (LCG) mode, the second switch transistor is turned on in a third period of the readout period of the photodiode, in which each pixel operates in an ultra low conversion gain (ULCG) mode, is configured to turn off in a first period and to turn on in a second period of an exposure period of the photodiode, and the reset transistor is configured to turn on in the first period and turned off in a second period of the exposure period of the photodiode.

BRIEF DESCRIPTION OF THE DRAWINGS

Embodiments will be more clearly understood from the following detailed description taken in conjunction with the accompanying drawings in which.

DETAILED DESCRIPTION

Hereinafter, various example embodiments are described in detail with reference to the accompanying drawings.

Figure 1:
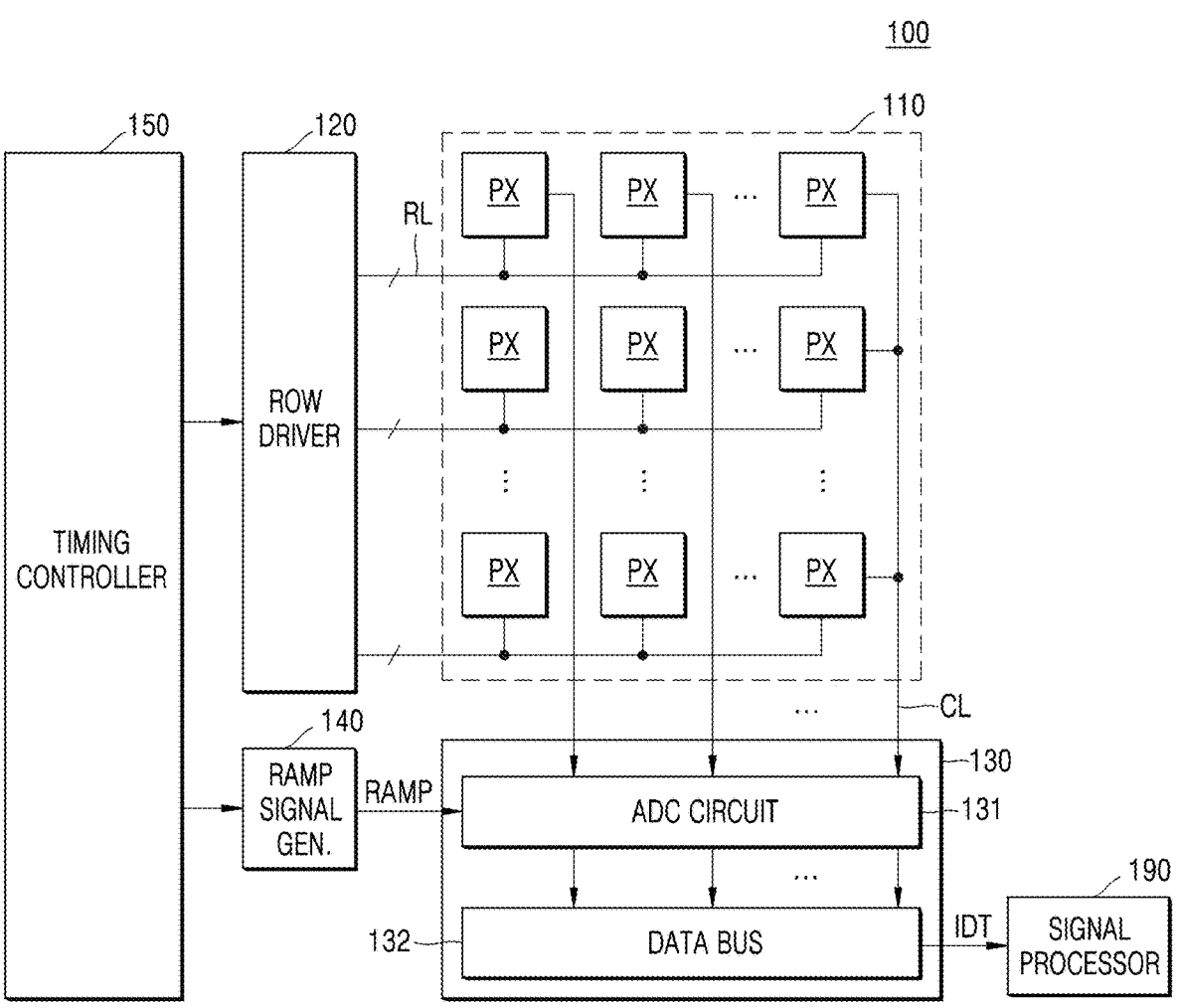
FIG. 1 is a block diagram illustrating an image sensor according to various example embodiments.

FIG. 1 is a block diagram illustrating an image sensor 100 according to various example embodiments.

The image sensor 100 may be mounted in an electronic device having an image and/or light sensing function. For example, image sensors 100 may mounted in electronic devices, such as one or more of cameras, smartphones, wearable devices, Internet of things (IoT) devices, home appliances, tablet personal computers (PCs), personal digital assistants (PDAs), portable multimedia players (PMPs), navigation devices, drones, advanced drivers assistance systems (ADASs), and the like. Alternatively or additionally, the image sensor 100 may be mounted in electronic devices provided as parts in vehicles, furniture, manufacturing facilities, doors, and various measurement devices.

Referring to FIG. 1, the image sensor 100 may include a pixel array 110, a row driver 120, a readout circuit 130, a ramp signal generator 140, a timing controller 150, and a signal processor 190, and the readout circuit 130 may include an analog-to-digital conversion (ADC) circuit 131 and a data bus 132.

The pixel array 110 may include a plurality of row lines RL, a plurality of column lines CL, and a plurality of pixels PX connected to the row lines RL and the column lines CL and arranged in rows and columns. A number of row lines RL may be the same as, greater than, or less than a number of column lines CL. The pixels PX may include active pixel sensors (APS).

Each of the pixels PX may include at least one photoelectric conversion element, and the pixel PX may detect light using the photoelectric conversion element and output an image signal that is an electrical signal according to detected light. For example, the photoelectric conversion element may include a photo detecting element including an organic material and/or an inorganic material, such as one or more of an inorganic photodiode, an organic photodiode, a perovskite photodiode, a photo transistor, a photo gate, or a pinned photodiode. In various example embodiments, each of the pixels PX may include a plurality of photoelectric conversion elements.

Meanwhile, a microlens (not shown in FIG. 1) for collecting light may be located above each of the pixels PX or above each of pixel groups including adjacent pixels PX. Each of the pixels PX may detect light in a specific spectral range from light received through the microlens. For example, the pixel array 110 may include a red pixel for converting light of a red spectral range into an electrical signal, a green pixel for converting light of a green spectral range into an electrical signal, and a blue pixel for converting light of a blue spectral range into an electrical signal. A color filter for transmitting light of a specific spectral range may be located above each of the pixels PX. In some example embodiments, the pixels PX may be arranged according to a Bayer pattern. However, inventive concepts are not limited thereto, and the pixel array 110 may include pixels that convert light of a spectral range other than red, green, and blue into electrical signals.

In various example embodiments, the pixels PX may have a multi-layer structure. The multi-layered pixel PX may include a plurality of stacked photoelectric conversion elements that convert light of different spectral ranges into electrical signals, and electrical signals corresponding to different colors may be generated from the photoelectric conversion elements. In other words, electrical signals corresponding to a plurality of colors may be output from one pixel PX.

A color filter array for transmitting light in a specific spectral range may be located above the pixels PX, and a color that a corresponding pixel may detect may be determined according to the color filter located above each of the pixels. However, inventive concepts are not limited thereto, and in various example embodiments, a certain photoelectric conversion element may convert light of a specific wavelength band into an electrical signal according to a level of an electrical signal applied thereto.

In each of the pixels PX, charges generated by the photoelectric conversion element, such as a photodiode, may be accumulated in a floating diffusion node, and the charges accumulated in the floating diffusion node may be converted into a voltage. In this case, a rate at which the charge accumulated in the floating diffusion node is converted into a voltage may be referred to as a conversion gain. The conversion gain may vary according to the capacitance of the floating diffusion node.

In various example embodiments, if the capacitance of the floating diffusion node increases, the conversion gain may decrease, and if the capacitance of the floating diffusion node decreases, the conversion gain may increase. In some example embodiments, each of the pixels PX may operate in a plurality of conversion gain modes, e.g., may operate in triple conversion gain modes. The triple conversion gain modes may include a high conversion gain (HCG) mode, a low conversion gain (LCG) mode, and an ultra low conversion gain (ULCG) mode. The meaning of 'operating in the triple conversion gain modes' may indicate a case of operating while continuously changing from the ULCG mode to the LCG mode and from the LCG mode to the HCG mode, and may include a case of operating while continuously changing from the HCG mode to the LCG mode and from the LCG mode to the ULCG mode.

The conversion gain, which is the rate at which charge is converted into voltage, may be highest in the HCG mode and lowest in the ULCG mode. Therefore, in the HCG mode, an operation of generating a pixel signal corresponding to an illuminance lower than that of the LCG mode and the ULCG mode may be performed. In the LCG mode, an operation of generating a pixel signal corresponding to an illuminance lower than that of the ULCG mode may be performed.

In some example embodiments, the photodiode may generate pixel signals in the triple conversion gain modes described above. In detail, the photodiode may operate in the HCG mode to generate a first pixel signal corresponding to a first illuminance range that is the lowest illuminance range. The photodiode may operate in the LCG mode to generate a second pixel signal corresponding to a second illuminance range that is higher than the first illuminance range. The photodiode may operate in the ULCG mode to generate a third pixel signal corresponding to a third illuminance range that is higher than the second illuminance range. The first to third pixel signals generated through the triple conversion gain modes may be synthesized into a single image. Accordingly, the resultant image may have a high dynamic range and/or motion artifacts may be removed.

In some example embodiments, each of the pixels PX may operate in a single exposure method in which one exposure is performed or in a multiple exposure method in which multiple exposures are performed. For example, the pixel PX may be operated in the single exposure method in which pixel signals are generated through the photodiode after a single exposure operation. Alternatively or additionally, the pixel PX may operate in the multiple exposure method in which a pixel signal is generated through the photodiode in response to a first exposure operation and then a pixel signal is additionally generated through the photodiode in response to a second exposure operation.

The row driver 120 drives the pixel array 110, e.g. row by row. The row driver 120 may decode a row control signal (e.g., an address signal) received from the timing controller 150, and select at least one row line from among row lines constituting the pixel array in response to the decoded row control signal. For example, the row driver 120 may generate a selection signal for selecting one of a plurality of rows. The pixel array 110 outputs pixel signals from a row selected by the selection signal provided from the row driver 120.

The row driver 120 may transmit control signals for outputting pixel signals to the pixel array 110, and the pixels PX may operate in response to the control signals to output pixel signals. For example, the row driver 120 may generate control signals for controlling the photodiode to operate in the HCG mode, the LCG mode, or the ULCG mode during a readout period, and provide the generated control signals to the pixel array 110.

The ramp signal generator circuit or ramp signal generator 140 may generate a ramp signal RAMP that increases or decreases with a certain slope and provide the ramp signal RAMP to the ADC circuit 131 of the readout circuit 130.

The readout circuit 130 may read out a pixel signal from the pixels PXs of the row selected by the row driver 120 among the pixels PXs. In this case, the pixel signal may include a reset signal or an image signal (or sensing signal). The readout circuit 130 may convert reset signals and image signals received from the pixel array 110 through the column lines CL into digital data based on the ramp signal RAMP from the ramp signal generator 140 to generate and output pixel values corresponding to the pixels PX in units of rows.

The ADC circuit 131 may include a plurality of ADCs corresponding to the column lines CL, and each of the ADCs may compare the reset signal and the image signal received through the corresponding column line CL with the ramp signal RAMP and may generate a pixel value based on comparison results. For example, the ADC may remove the reset signal from the image signal and generate a pixel value representing the amount of light detected by the pixel PX.

A plurality of pixel values generated by the ADC circuit 131 may be output as image data IDT through the data bus 132. For example, the image data IDT may be provided to an internal or external image signal processor of the image sensor 100.

The data bus 132 may store, e.g. temporarily store the pixel values output from the ADC circuit 131 and then output the temporarily stored pixel value. The data bus 132 may include a plurality of column memories and column decoders. The pixel values stored in the column memories may be output as image data IDT under control by the column decoder.

The ADC circuit 131 may include a plurality of correlated double sampling (CDS) circuits (not shown) and/or a plurality of counter circuits (not shown). The ADC circuit 131 may convert a pixel signal input from the pixel array 110 into a pixel value that is a digital signal. Each pixel signal received through each of the column lines CL is converted into a pixel value, which is a digital signal, by the CDS circuit and the counter circuit.

The CDS circuit may compare the pixel signal received through the column line CL with the ramp signal RAMP and output a comparison result. When a level of the ramp signal RAMP is equal to a level of the pixel signal, the CDS circuit may output a comparison signal that transitions from a first level (e.g., logic high) to a second level (e.g., logic low). A time point at which a level of the comparison signal transitions may be determined according to the level of the pixel signal.

The CDS circuit may sample and hold the pixel signal provided from the pixel PX according to a CDS method, may doubly sample a level of certain noise (e.g., a reset signal) and a level according to an image signal, and generate a comparison signal based on a level corresponding to a difference therebetween.

In some example embodiments, the CDS circuit may include one or more comparators. The comparator may be implemented as an operational transconductance amplifier (OTA) (or differential amplifier), for example.

The ADC circuit 131 may include a plurality of delta reset sampling (DRS) circuits (not shown). The DRS circuit may sample a provided pixel signal by first reading out an image signal and then reading out a reset signal according to a DRS method.

In some example embodiments, the image sensor 100 may further include a bias current controller (not shown) for increasing or decreasing a bias current when an operating mode of the pixel PX changes (e.g., from the ULCG mode to the LCG mode and/or from the LCG mode to the HCG mode and/or from HCG mode to the LCG mode and/or from LCG mode to the ULCG mode) during the readout period, and a plurality of bias current controllers may be respectively connected to the column lines CL. For example, a current amount of a bias current when the pixel PX operates in the HCG mode may be less than a current amount of the bias current when the pixel PX operates in the LCG mode. A current amount of the bias current when the pixel PX operates in the LCG mode may be less than a current amount of the bias current when the pixel PX operates in the ULCG mode.

The signal processor 190 may perform one or more of noise reduction processing, gain adjustment, waveform shaping processing, interpolation processing, white balance processing, gamma processing, edge enhancement processing, binning, and the like on image data. In some example embodiments, as the pixel array 110 operates in the HCG mode, the LCG mode, and/or the ULCG mode of the photodiode during one frame period, the signal processor 190 may receive pixel signals corresponding to the aforementioned modes from the data bus 132 and merge the received pixel signals to generate an image having a high dynamic range. Meanwhile, in various example embodiments, the signal processor 190 may be provided in an external processor of the image sensor 100.

Figure 2:
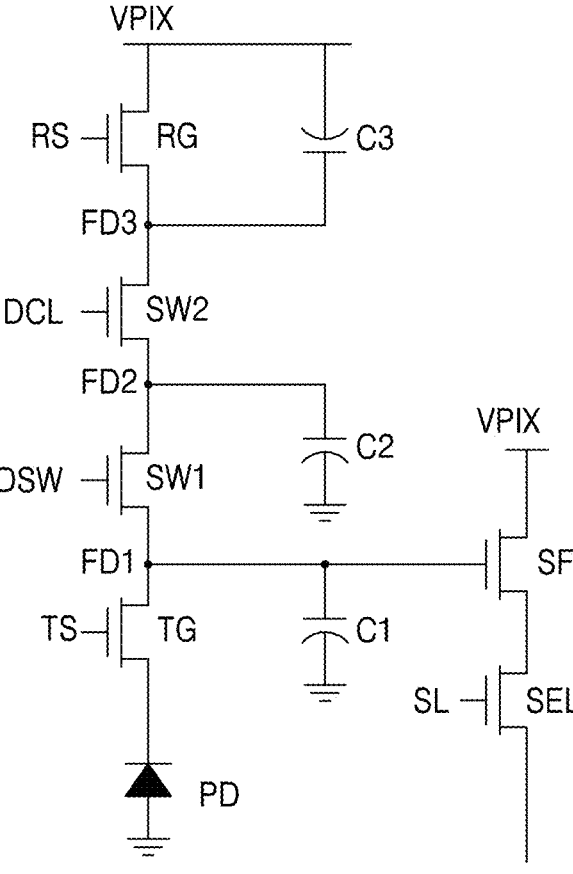
FIG. 2 is a circuit diagram of a pixel according to various example embodiments.

FIG. 2 is a circuit diagram of a pixel according to various example embodiments. In detail, FIG. 2 is a circuit diagram of the pixel PX of FIG. 1 according to various example embodiments.

Referring to FIGS. 1 and 2, the pixel PX may include a photodiode PD, a plurality of transistors, e.g., a transfer transistor TG, a first switch transistor SW1, a second switch transistor SW2, a reset transistor RG, a source follower transistor SF, and a select transistor SEL, and a first capacitor C1, a second capacitor C2, and a third capacitor C3. Control signals, such as one or more of a transfer control signal TS, a first switch control signal DSW, a second switch control signal DCL, a reset control signal RS, and a selection signal SL, may be applied to the pixel PX, and at least some of the control signals may be generated by the row driver 120.

Although each of the transfer transistor TG, the first switch transistor SW1, the second switch transistor SW2, the reset transistor RG, the source follower transistor SF, and the select transistor SEL are illustrated as NMOS transistors, example embodiments are not limited thereto. For example, at least one of the transfer transistor TG, the first switch transistor SW1, the second switch transistor SW2, the reset transistor RG, the source follower transistor SF, and the select transistor SEL may be a PMOS transistor. Alternatively or additionally, a threshold voltage of each of the transfer transistor TG, the first switch transistor SW1, the second switch transistor SW2, the reset transistor RG, the source follower transistor SF, and the select transistor SEL may be the same, or alternatively at least one threshold voltage may be different.

The photodiode PD may generate photocharges that vary according to the intensity of light. For example, the photodiode PD may generate charge, for example, an electron that is a negative charge and a hole that is a positive charge, in proportion to the amount of incident light. Photocharges generated by the photodiode PD may be transferred to and accumulated in at least one of first to third floating diffusion nodes FD1, FD2, and FD3. For example, the photocharges generated by the photodiode PD may be transferred only to and accumulated in the first floating diffusion node FD1, may be transferred to and accumulated in the first floating diffusion node FD1 and the second floating diffusion node FD2, or may be transferred to and accumulated in the first to third floating diffusion nodes FD1, FD2, and FD3. A parasitic capacitor may be formed at each of the first to third floating diffusion nodes FD1, FD2, and FD3, or an actual intentionally designed capacitor element, together with the parasitic capacitor, may be connected thereto.

One end (e.g. a source or a drain end) of the transfer transistor TG may be connected to the photodiode PD, and another end thereof (e.g. a drain or a source end) may be connected to the first floating diffusion node FD1. The transfer transistor TG may be turned on or off in response to the transfer control signal TS received from the row driver 120. The transfer transistor TG may transfer photocharges generated by the photodiode PD to the first floating diffusion node FD1.

One end (e.g. a source or a drain end) of the first switch transistor SW1 may be connected to the first floating diffusion node FD1 and another end thereof (e.g. a drain or a source end) may be connected to the second floating diffusion node FD2. The first switch transistor SW1 may be turned on or off in response to the first switch control signal DSW received from the row driver 120, and may connect the first floating diffusion node FD1 to the second floating diffusion node FD2.

One end (e.g. a source or a drain end) of the second switch transistor SW2 may be connected to the second floating diffusion node FD2 and another end thereof (e.g. a drain or a source end) may be connected to the third floating diffusion node FD3. The second switch transistor SW2 may be turned on or off in response to the second switch control signal DCL received from the row driver 120, and may connect the second floating diffusion node FD2 to the third floating diffusion node FD3.

One end of the first capacitor C1 may be connected to the first floating diffusion node FD1, and a ground voltage may be applied to the other end thereof. When the transfer transistor TG is turned on, photocharges generated by the photodiode PD may be transferred to the first floating diffusion node FD1. Accordingly, photocharges may be accumulated in the first capacitor C1 connected to the first floating diffusion node FD1.

Also, according to various example embodiments, charges from the photodiode PD may overflow due to an exposure operation in a high-illuminance situation, and the overflowed charges may be accumulated in the first capacitor C1 connected to the first floating diffusion node FD1. The first capacitor C1 may store an overflow charge amount and a reset charge amount. The overflow charge amount may correspond to charges accumulated in the first capacitor C1 due to overflow exceeding a capacity, e.g. a maximum charge accumulation capacity of the photodiode PD even when the transfer transistor TG is turned off. The reset charge amount may refer to a charge amount corresponding to a voltage of the first floating diffusion node FD1 according to a reset operation of resetting the first floating diffusion node FD1. For example, the overflowed charges may be accumulated in the first capacitor C1 even when the transfer transistor TG of the photodiode PD is turned off.

One end of the second capacitor C2 may be connected to the second floating diffusion node FD2, and a ground voltage may be applied to the other end thereof. When the first switch transistor SW1 is turned on, the first floating diffusion node FD1 may be connected to the second floating diffusion node FD2. For example, the first capacitor C1 and the second capacitor C2 may be parallel with one another. Accordingly, a total capacitance of the first floating diffusion node FD1 connected to the gate terminal of the source follower transistor SF may increase by the sum of the capacitance of the first capacitor C1 and the capacitance of the second capacitor C2, and the pixel may output an output voltage of LCG.

In addition, according to various example embodiments, charges from the photodiode PD may overflow due to an exposure operation in a high-illuminance situation, and the overflowed charges may be accumulated in the first capacitor C1 and the second capacitor C2. A portion of the overflow charge amount and a reset charge amount may be stored in the second capacitor C2. The overflowed charge may be accumulated in the first capacitor C1 and the second capacitor C2 even when the transfer transistor TG is turned off.

One end of the third capacitor C3 may be connected to the third floating diffusion node FD3, and a pixel voltage VPIX may be applied to the other end thereof. However, inventive concepts are not limited thereto, and a voltage, other than the pixel voltage VPIX, e.g., a ground voltage, may be applied to the third capacitor C3. When the second switch transistor SW2 is turned on, the second floating diffusion node FD2 may be connected to the third floating diffusion node FD3. When the first switch transistor SW1 is turned on, the first through third capacitors C1-C3 may be parallel, and a total capacitance of the first floating diffusion node FD1 connected to the gate terminal of the source follower transistor SF may increase by the sum of capacitance of the first capacitor C1, capacitance of the second capacitor C2, and capacitance of the third capacitor C3. Accordingly, the pixel may output an output voltage corresponding to the ULCG.

Alternatively or additionally, according to various example embodiments, the charges from the photodiode PD may overflow due to an exposure operation in a high-illuminance situation, and the overflowed charges may be accumulated in the first capacitor C1, the second capacitor C2, and the third capacitor C3. A portion of the overflowed charges and the reset charge amount may be stored in the third capacitor C3. For example, the overflowed charges may be accumulated in the first capacitor C1, the second capacitor C2, and the third capacitor C3 even when the transfer transistor TG is turned off.

The capacitance of the first capacitor C1 may be determined by a junction capacitance of the first floating diffusion node FD1 and parasitic capacitors of nodes connected thereto. The second capacitor C2 and/or the third capacitor C3 may be metal insulator metal (MIM)-type capacitors and/or cylinder type-capacitors used in DRAM. The capacitance of the first capacitor C1 may be less than that of the second capacitor C2. The capacitance of the second capacitor C2 may be less than that of the third capacitor C3. For example, the capacitance of the third capacitor C3 may be greater than that of the second capacitor C2, and the capacitance of the second capacitor C2 may be greater than the capacitance of the first capacitor C1.

In some example embodiments, a capacitance ratio of the first capacitor C1, the second capacitor C2, and the third capacitor C3 may be 1:7:248. For example, referring to FIGS. 2 and 3, total capacitance of the first capacitor C1 may be capacitance of the first floating diffusion node FD1, the total capacitance of the second capacitor C2 may be a value obtained by excluding the capacitance of the first floating diffusion node FD1 from the capacitance of the second floating diffusion node FD2, and the total capacitance of the third capacitor C3 may be a value obtained by excluding the capacitance of the second floating diffusion node FD2 and the capacitance of the first floating diffusion node FD1 from the capacitance of the third floating diffusion node FD3. For example, a capacitance ratio of the first floating diffusion node FD1, the second floating diffusion node FD2, and the third floating diffusion node FD3 may be 1:8:256. The ratio of the capacitances of the first capacitor C1, the second capacitor C2, and the third capacitor C3 and the ratio of the capacitances of the first floating diffusion node FD1, the second floating diffusion node FD2, and the third floating diffusion node FD3 may be an example and inventive concepts are not limited thereto. The first to third capacitors C1, C2 and C3 are described in detail with reference to FIG. 3 below.

The reset transistor RG may reset charges accumulated in at least one of the first to third floating diffusion nodes FD1, FD2, and FD3. The pixel voltage VPIX may be applied to one end of the reset transistor RG, and the other end thereof may be connected to the third floating diffusion node FD3. However, inventive concepts are not limited thereto, and a voltage, other than the pixel voltage VPIX, may be applied to the reset transistor RG. The reset transistor RG may be turned on or off in response to the reset control signal RS received from the row driver 120. Accordingly, charges accumulated in at least one of the first to third floating diffusion nodes FD1, FD2, and FD3 may be discharged so that at least one of the first to third floating diffusion nodes FD1, FD2, and FD3 may be reset.

One end of the source follower transistor SF may be connected to the selection transistor SEL, and the pixel voltage VPIX may be applied to the other end thereof. The source follower transistor SF may be referred to as a driving transistor. The source follower transistor SF may operate based on a bias current generated by a current source connected to the column line CL, and a voltage corresponding to the charge accumulated in at least one of first to third floating diffusion nodes FD1, FD2, and FD3 may be output as a pixel signal.

One end of (e.g. a source or a drain end) the selection transistor SEL may be connected to the source follower transistor SF, and another end thereof (e.g., a drain or a source end) may be connected to the column line CL. The selection transistor SEL may be turned on or off in response to the selection signal SL received from the row driver 120. When the select transistor SEL is turned on during the readout operation, a pixel signal including a reset signal corresponding to a reset operation or an image signal corresponding to a charge accumulation operation may be output to the column line CL.

According to various example embodiments, pixel signals respectively corresponding to conversion gain modes may be generated by accumulating charges generated in the photodiode PD using the first to third floating diffusion nodes FD1, FD2, and FD3 and the first to third capacitors C1, C2, and C3. Accordingly, the image sensor may generate image data having a wide dynamic range and/or an improved signal-to-noise ratio (SNR).

Figure 3:
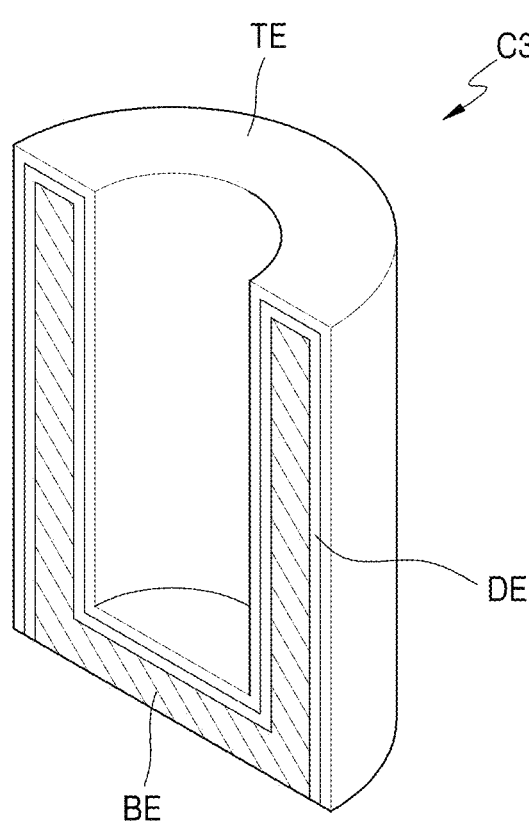
FIG. 3 is a diagram illustrating a capacitor according to various example embodiments.

FIG. 3 is a diagram illustrating a capacitor according to various example embodiments. In detail, FIG. 3 is a diagram illustrating at least one of the first to third capacitors C1, C2, and C3, such as third capacitor C3, of FIG. 2 according to various example embodiments.

Referring to FIGS. 2 and 3, the pixel PX may include first to third capacitors C1, C2, and C3. The first to third capacitors C1, C2, and C3 may be provided in the form of capacitors used in DRAM cells.

In order to accommodate a large amount of charges overflowing from the photodiode PD in the ULCG mode, a capacitor such as the third capacitor C3 may be provided in a cylindrical shape as shown. Because a capacitance of a capacitor is generally proportional to an effective surface area of the capacitor, permittivity of a dielectric, and inversely proportional to a thickness of the dielectric, the effective surface area of the capacitor may be increased by forming the third capacitor C3 to have a cylindrical shape Therefore, the capacitance of the capacitor may significantly increase. The third capacitor C3 may include at least one cylindrical capacitor. A structure of the third capacitor C3 is not limited to thereto and may be modified to have various forms. In addition, structures of the first capacitor C1 and the second capacitor C2 are not limited thereto and may be modified to have various forms. Hereinafter, the structure of the third capacitor C3 is described in FIG. 3.

In detail, the third capacitor C3 may include a top electrode TE, a bottom electrode BE, and a dielectric layer DE. The top electrode TE and the bottom electrode BE of the third capacitor C3 may have a cylinder shape, and the dielectric layer DE may be disposed therebetween. The top electrode TE and the bottom electrode BE of the third capacitor C3 are formed to have a hollow circular cylinder shape and face each other with the dielectric layer DE therebetween, and the dielectric layer DE may be formed conformally along a surface of the bottom electrode BE.

The top electrode TE and the bottom electrode BE may include polysilicon such as doped and/or undoped polysilicon, metal, metal nitride, metal oxide, or combinations thereof. The dielectric layer DE may include nitride, oxide, metal oxide, or combinations thereof. For example, the dielectric layer DE may include a high-k material, such as one or more of a hafnium oxide ($HfO_2$) layer or a zirconium oxide ($ZrO_2$) layer, but is not limited thereto.

Figure 4:
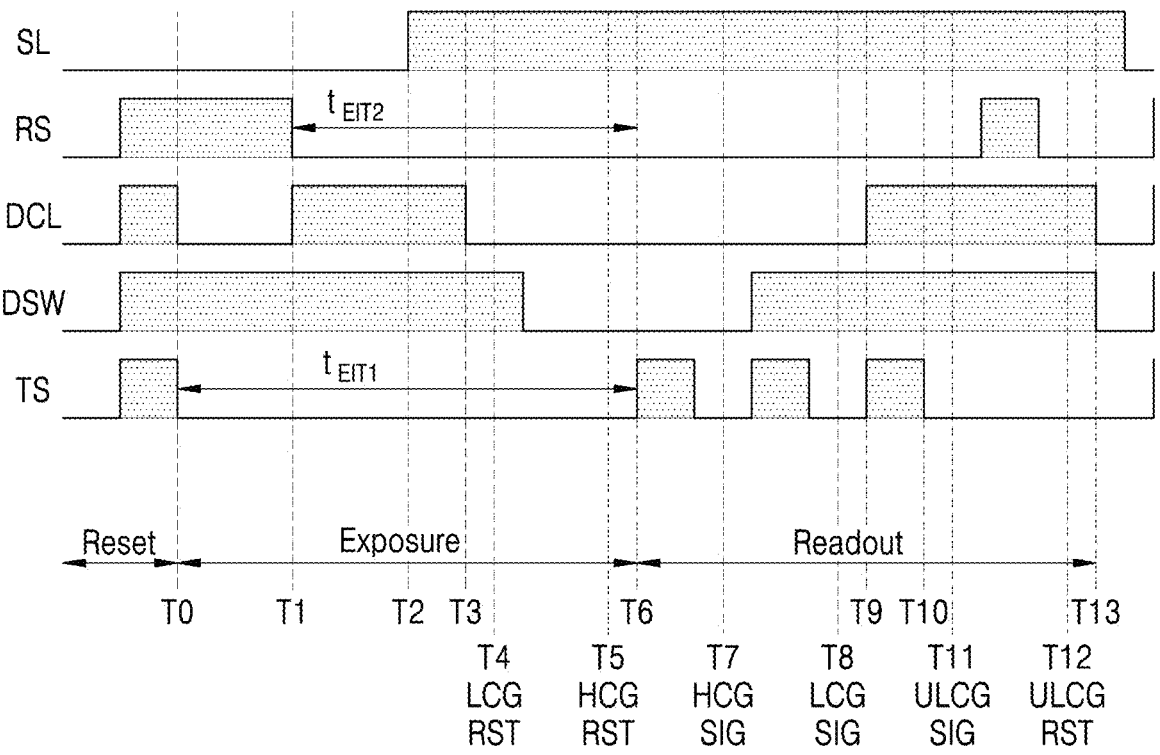
FIG. 4 is a timing diagram illustrating an operation of a pixel according to various example embodiments.

FIG. 4 is a timing diagram illustrating an operation of a pixel according to various example embodiments. In detail, FIG. 4 is a timing diagram illustrating an operation of the pixel PX of FIG. 2 according to various example embodiments.

Referring to FIGS. 2 and 4, the pixel PX may reset the first to third floating diffusion nodes FD1, FD2, and FD3 during a reset period, and the photodiode PD may receive an optical signal to generate and accumulate photocharges (e.g. electrons and/or holes) during an exposure period. During the readout period, pixel signals may be read out from the photodiode PD. Hereinafter, operations performed during the reset period, exposure period, and readout period are described.

First, during the reset period, the selection signal SL may maintain a first level (e.g., logic low). The reset control signal RS, the transfer control signal TS, the first switch control signal DSW, and the second switch control signal DCL may transition from a first level to a second level (e.g., logic high). Accordingly, the reset transistor RG, the transfer transistor TG, the first switch transistor SW1, and the second switch transistor SW2 may be turned on. That is, during the reset period, the pixel voltage VPIX may be applied to reset the photodiode PD, the first to third floating diffusion nodes FD1, FD2, and FD3, and the first to third capacitors C1, C2, and C3 connected thereto.

During the exposure period, the second switch control signal DCL and the transfer control signal TS may transition from the second level to the first level at a first time point T0, and the reset control signal RS and the first switch control signal DSW may maintain the second level. Accordingly, the second switch transistor SW2 and the transfer transistor TG may be turned off, and the reset transistor RG and the first switch transistor SW1 may remain turned on.

At the first point in time T0, the photodiode PD may generate and accumulate the photocharges according to a received optical signal, and a reset charge amount corresponding to a voltage of the first floating diffusion node FD1 which is reset may be accumulated in the first capacitor C1 and a reset charge amount corresponding to a voltage of the second floating diffusion node FD2 which is reset may be accumulated in the second capacitor C2.

The time from the first time point T0 of the exposure period to a first time point T6 of the readout period at which the transfer transistor TG is turned off, during which the first level is maintained, may be referred to as a first effective integration time (EIT) $t_{EIT1}$. The photodiode PD of the pixel PX may generate photocharges during the first EIT $t_{EIT1}$ and may integrate (or accumulate) the photocharges. When the generated photocharges exceed the maximum accumulation charge capacity of the photodiode PD, the overflowed charge may be accumulated in the first capacitor C1 of the first floating diffusion node FD1 and the second capacitor C2 of the second floating diffusion node FD2 through the first switch SW1, even when the transfer transistor TG is turned off.

Also, at a second time point T1 of the exposure period, the second switch control signal DCL may transition from the first level to the second level, and the reset control signal RS may transition from the second level to the first level. The first switch control signal DSW may be maintained at the second level, and the transfer control signal TS may be maintained at the first level. Accordingly, the second switch transistor SW2 may be turned on, and the first switch transistor SW1 may remain turned on. Overflowed charges, exceeding the capacity or the maximum accumulation charge capacity, generated by the photodiode PD may be transferred to and accumulated in the first capacitor C1, the second capacitor C2, and the third capacitor C3. The time from the second time point T1 of the exposure period to the first time point T6 of the readout period at which the transfer transistor TG is turned off, during which the first level is maintained, may be referred to as a second EIT $t_{EIT2}$. The third capacitor C3 may integrate photocharges during the second EIT $t_{EIT2}$. In detail, during the second EIT $t_{EIT2}$, a portion of the overflowed charges generated by the photodiode PD may be accumulated in the third capacitor C3.

According to various example embodiments, by controlling the reset control signal RS and the second switch control signal DCL during the exposure period, the amount of charges overflowed to the third capacitor C3 may be adjusted by adjusting the second EIT $t_{EIT2}$.

For example, when the turn-on of the reset control signal RS is maintained for a long time, the second EIT $t_{EIT2}$ may be shortened, so that the third capacitor C3 may accumulate relatively less charges overflowed from the photodiode PD. Conversely, when the turn-on of the reset control signal RS is maintained for a short time, the second EIT $t_{EIT2}$ may be lengthened, so that the third capacitor C3 may accumulate a relatively large amount of charges overflowed from the photodiode PD.

Accordingly, by controlling the amount of charges overflowed to the third capacitor C3 by adjusting the second EIT $t_{EIT2}$, the image sensor of inventive concepts may generate image data having a wide dynamic range and an improved SNR.

At a third time point T2 of the exposure period, the selection signal SL may transition from the first level to the second level. Accordingly, the selection transistor SEL may be turned on. The selection signal SL may maintain the second level after transitioning to the second level.

At a fourth time point T3 of the exposure period, the second switch control signal DCL may transition from the second level to the first level. Accordingly, the second switch transistor SW2 may be turned off. As the second switch transistor SW2 is turned off, the second floating diffusion node FD2 may not be connected to the third floating diffusion node FD3. A period from the third time point T2 to the fourth time point T3 of the exposure period may be omitted for convenience.

At a fifth time point T4 of the exposure period, the reset control signal RS may maintain the first level, the first switch control signal DSW may maintain the second level, and the second switch control signal DCL may maintain the first level. Accordingly, the first switch transistor SW1 may remain turned on, and the second switch transistor SW2 and reset transistor RG may remain turned off. Because the first floating diffusion node FD1 may be connected to the second floating diffusion node FD2 and the second floating diffusion node FD2 is not connected to the third floating diffusion node FD3, the pixel PX may operate in the LCG mode. Also, a reset signal LCG RST corresponding to the LCG mode may be output through the column line CL. That is, referring to FIG. 4, the pixel signal output at the third time point T2 may be the reset signal LCG RST of the LCG mode of the photodiode PD. Because the selection control signal SL is at the second level, the selection transistor SEL may be turned on so that the reset signal LCG RST of the LCG mode of the photodiode PD may be output through the selection transistor SEL.

At a sixth time point T5 of the exposure period, the reset control signal RS and the second switch control signal DCL may maintain the first level. However, the first switch control signal DSW may transition from the second level to the first level. Accordingly, the first switch transistor SW1 may be turned off, and the reset transistor RG and the second switch transistor SW2 may remain turned off. Because the first floating diffusion node FD1 is not connected to the second floating diffusion node FD2, the pixel PX may operate in the HCG mode. Alternatively or additionally, a reset signal HCG RST corresponding to the HCG mode may be output through the column line CL. For example, referring to FIG. 4, the pixel signal output at the fourth time point T3 may be a reset signal of the HCG mode of the photodiode PD. Because the selection control signal SL is at the second level, the selection transistor SEL is turned on so that the reset signal HCG RST of the HCG mode of the photodiode PD may be output through the selection transistor SEL.

The readout period for the pixel signal may start at a start time point T6. The start time point T6 may be referred to as the first time point T6 of the readout period.

At the first time point T6 of the readout period, the transfer control signal TS may transition from the first level to the second level. Accordingly, the transfer transistor TG may be turned on. At the first time point T0 of the exposure period, the transfer transistor TG is turned off to maintain the first level until the 41st time point T of the readout period. At the second time point T1 of the exposure period, the reset transistor RG is turned off to maintain the first level until the first time point T6 of the readout period.

After the first time point T6 of the readout period, the transfer control signal TS may transition from the first level to the second level. Accordingly, the transfer transistor TG may be turned on, and charges accumulated in the photodiode PD may be transferred to the first floating diffusion node FD1.

At a second time point T7 of the readout period, the transfer control signal TS may be at the first level instead of the second level, and the first switch control signal DSW and the second switch control signal DCL may maintain the first level. Accordingly, the transfer transistor TG may be turned off, and the first switch transistor SW1 and the second switch transistor SW2 may also be turned off. Because the first floating node FD1 is not connected to the second floating diffusion node FD2, the pixel PX may operate in the HCG mode. Alternatively or additionally, an image signal HCG SIG corresponding to the amount of charge transferred to the first floating diffusion node FD1 may be output through the column line CL. The first pixel signal may be generated through a CDS operation using the image signal HCG SIG and the reset signal HCG RST.

After the second time point T7 of the readout period, the first switch control signal DSW may transition to the second level, instead of the first level. Accordingly, the first switch transistor SW1 may be turned on, and the first floating diffusion node FD1 may be connected to the second floating diffusion node FD2. The transfer control signal TS may transition from the first level to the second level Accordingly, the transfer transistor TG may be turned on. Charges generated by the photodiode PD may be accumulated in the first capacitor C1 of or connected to the first floating diffusion node FD1 and the second capacitor C2 of or connected to the second floating diffusion node FD2.

At a third time point T8 of the readout period, the transfer control signal TS may transition to the first level, instead of the second level. Thereafter, the first switch control signal DSW may transition from the first level to the second level. Accordingly, the first floating diffusion node FD1 may be connected to the second floating diffusion node FD2 and the second floating diffusion node FD2 is not connected to the third floating diffusion node FD3, and thus, the image signal LCG SIG corresponding to the first floating diffusion node FD1 may be output through the column line CL in the LCG mode in the pixel PX. A second pixel signal may be generated through a CDS operation using the image signal LCG SIG and the reset signal LCG RST.

From a fourth time point T9 to a fifth time point T10 of the readout period, the transfer control signal TS may transition from the first level to the second level, and the first switch control signal DSW may maintain the first level. The second switch control signal DCL may transition from the first level to the second level. Accordingly, the transfer transistor TG may be turned on, the first switch transistor SW1 may be turned on, and the second switch transistor SW2 may be turned on. Charges generated by the photodiode PD may move to and be accumulated in the first floating diffusion node FD1, the second floating diffusion node FD2, and the third floating diffusion node FD3.

At a sixth time point T11 of the readout period, the transfer control signal TS may be at the first level, instead of the second level, and the first switch control signal DSW and the second switch control signal DCL may maintain the second level. The transfer transistor TG may be turned off, and the first and second switch transistors SW1 and SW2 may remain turned on. Accordingly, the first floating diffusion node FD1 may be connected to the second floating diffusion node FD2 and the second floating diffusion node FD2 may be connected to the third floating diffusion node FD3, and thus, the pixel PX may operate in the ULCG mode. The third pixel signal may be generated through a CDS operation using the image signal ULCG SIG and the reset signal ULCG RST.

The image signal ULCG SIG of the ULCG mode may refer to an image signal based on overflowed charges. In this state, when a large amount of light is incident on the photodiode PD, photoelectric conversion may occur in the photodiode PD Charges generated by photoelectric conversion may first be accumulated in the photodiode PD, and the charges accumulated in the photodiode PD may overflow beyond a gate potential barrier of the turned-off transfer transistor TG. The overflowed charges may be transferred to and accumulated in the first to third floating diffusion nodes FD1, FD2, and FD3 and the first to third capacitors C1, C2 and C3.

In more detail, the overflowed charges may refer to charges that may move to and be accumulated in the first to third capacitors C1 to C3 connected to the first to third floating diffusion nodes FD1, FD2, and FD3 even when the transfer transistor TG is turned off, in a case in which a certain amount or more charges are accumulated in the photodiode PD. Even if a large amount of light is incident on the photodiode PD and charges greater than the amount of charge that may be accumulated in the photodiode PD are generated, an image signal corresponding to the amount of charges exceeding the amount of charges that may be accumulated in the photodiode PD may be output. Accordingly, the image data having a wide dynamic range may be generated.

After the sixth time point T11 of the readout period, the reset control signal RS may transition from the first level to the second level. Accordingly, the reset transistor RG may be turned on. Because the third floating diffusion node FD3 may be connected to the second floating diffusion node FD2 and the second floating diffusion node FD2 may be connected to the first floating diffusion node FD1, the first to third floating diffusion nodes FD1, FD2, and FD3 and the first to third capacitors C1, C2, and C3 may be reset.

At a seventh time point T12 of the readout period, the reset control signal RS may be at the first level, instead of the second level, and the first switch control signal DSW and the second switch control signal DCL may be maintained at the second level. Accordingly, the reset transistor RS may be turned off, and the first switch transistor SW1 and the second switch transistor SW2 may be turned on. Because the first floating diffusion node FD1 may be connected to the second floating diffusion node FD2 and the second floating diffusion node FD2 may be connected to the third floating diffusion node FD3, the pixel PX may operate in the ULCG mode. Also, a reset signal ULCG RST corresponding to the ULCG mode may be output through the column line CL. That is, referring to FIG. 4, the pixel signal output at the fifth time point T10 may be the reset signal ULCG RST of the ULCG mode of the photodiode PD. Because the selection control signal SL is at the second level, the selection transistor SEL may be turned on so that the reset signal ULCG RST of the ULCG mode of the photodiode PD may be output through the selection transistor SEL.

The first to third pixel signals output after an eighth time point T13 of the readout period may be summed or synthesized.

As described above, according to various example embodiments, using the first to third floating diffusion nodes FD1, FD2, and FD3 and the first to third capacitors C1, C2, and C3, the HCG image signal HCG SIG may be output in the HCG mode, the LCG image signal LCG SIG may be output in the LCG mode, and the ULCG image signal ULCG SIG may be output in the ULCG mode. By synthesizing and/or merging the output HCG image signal HCG SIG, the LCG image signal LCG SIG, and the ULCG image signal ULCG SIG, image data having an improved SNR of the pixel, while having a wide dynamic range may be generated.

FIGS. 5A to 5D are diagrams structurally illustrating potentials of capacitors connected to transistors and floating diffusion nodes according to various example embodiments. In detail, FIGS. 5A to 5D illustrate potentials of the photodiode PD, first to third floating diffusion nodes FD1, FD2, and FD3 and first to third capacitors C1, C2, and C3 of the pixel PX of FIG. 2. The vertical axes of FIGS. 5A to 5D represent indicators related to charge potentials. Hereinafter, descriptions are given with reference to FIGS. 2 and 4.

Figure 5A:
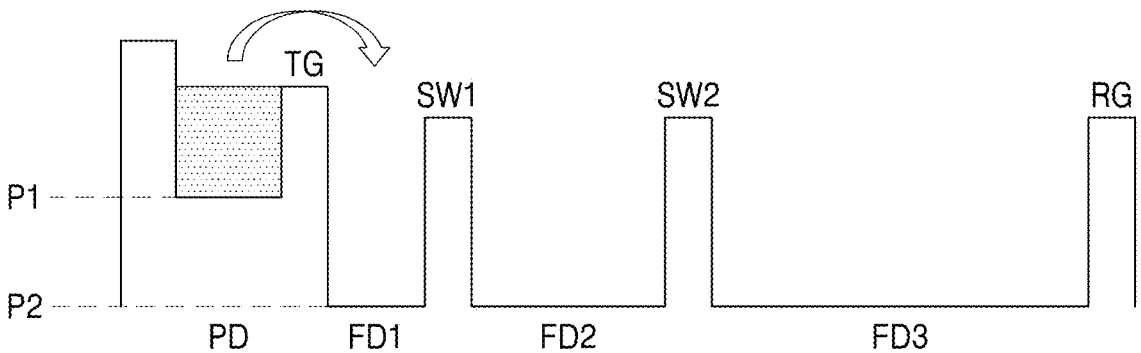
FIGS. 5A to 5D are diagrams structurally illustrating potentials of capacitors connected to transistors and floating diffusion nodes according to various example embodiments.

Referring to FIG. 5A, a capability or a maximum potential P1 of the photodiode PD may be greater than a potential P2 of the first floating diffusion node FD1. Accordingly, charges from the photodiode PD may overflow, and the overflowed charges may be accumulated in the first capacitor C1 connected to the first floating diffusion node FD1. For example, if the charges accumulated in the photodiode PD overflow in a high-illuminance situation, the overflowed charges may move to the first floating diffusion node FD1 due to a potential difference.

The potentials P2 of the first to third floating diffusion nodes FD1, FD2, and FD3 are illustrated to be the same, but are not limited thereto, and at least one of the first to third floating diffusion nodes FD1, FD2, and FD3 may have different potentials than others of the first to third floating diffusion nodes FD1, FD2, and FD3. For example, the potential of the first floating diffusion node FD1 may be higher than those of the second or third floating diffusion nodes FD2 and FD3.

FIG. 5A may show the potential at the third time point T2 of the exposure period of FIG. 4. Referring to FIGS. 5A and 4, at the third time point T2 of the exposure period, charges may be accumulated in the photodiode PD. Because the transfer control signal TS maintains the first level, the transfer transistor TG may be turned off and charges may not move to the first floating diffusion node FD1.

Figure 5B:
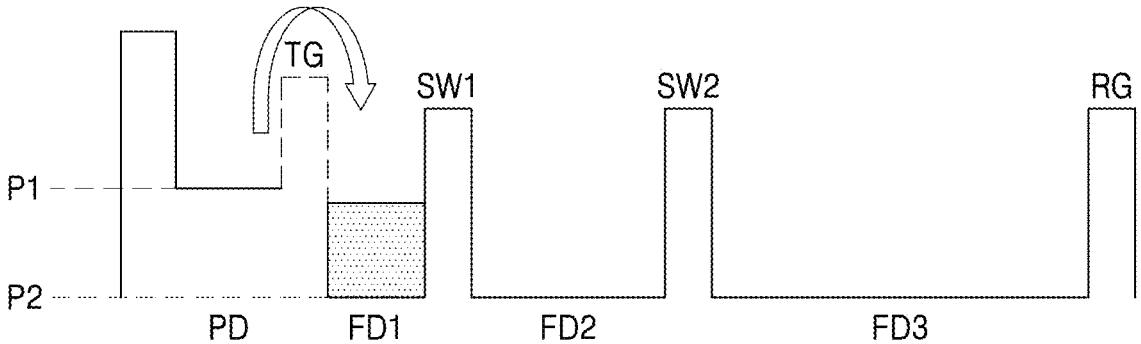

Referring to FIGS. 5B and 4, the transfer control signal TS may transition from the first level to the second level at the second time point T7 of the readout period. Accordingly, the transfer transistor TG may be turned on. Photocharges generated by the photodiode PD may move to the first floating diffusion node FD1. Because the first floating diffusion node FD1 is not connected to the second floating diffusion node FD2, the photocharges generated by the photodiode PD may be accumulated in the first capacitor C1 connected to the first floating diffusion node FD1. At this time, the pixel may operate in the HCG mode.

Figure 5C:
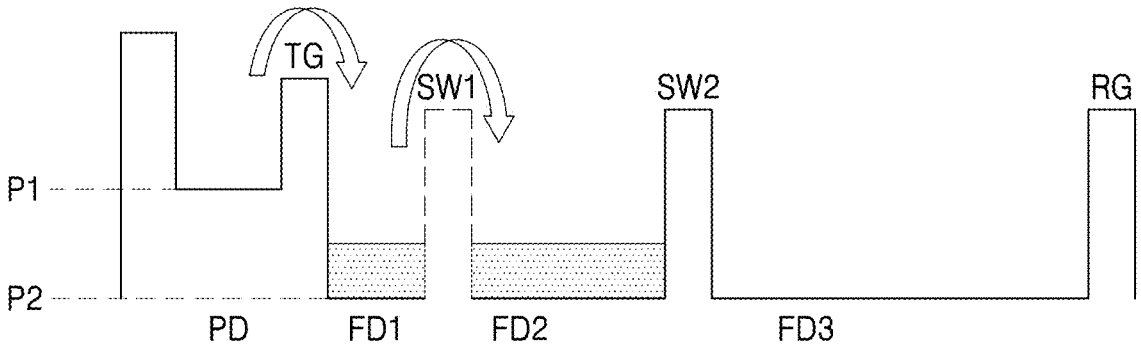

Referring to FIGS. 5C and 4, a portion of the photocharges accumulated in the first capacitor C1 and some of the photocharges generated by the photodiode PD after the third time point T8 of the readout period may move to the second floating diffusion node FD2. The photocharges generated by the photodiode PD may be accumulated in the first capacitor C1 connected to the first floating diffusion node FD1 and the second capacitor C2 connected to the second floating diffusion node FD2. The pixel PX may operate in the LCG mode.

Figure 5D:
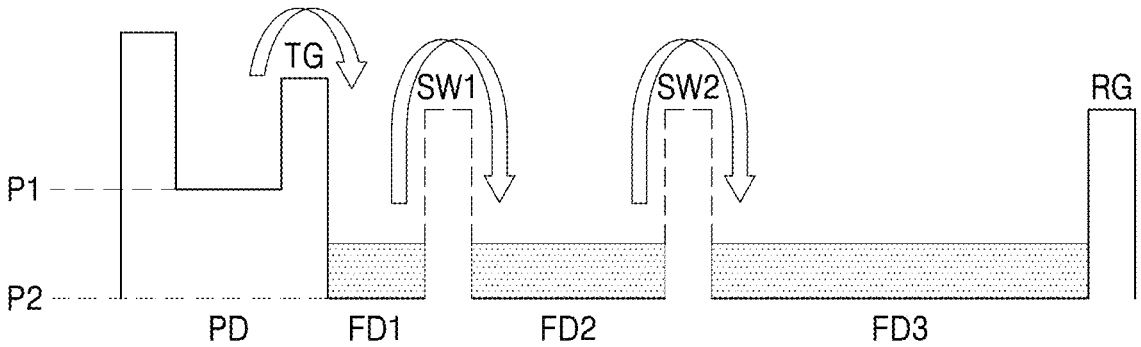

Referring to FIGS. 5D and 4, the transfer control signal TS may transition from the first level to the second level at the sixth time point T11 of the readout period. Accordingly, the transfer transistor TG may be turned on. The first floating diffusion node FD1 may be connected to the second floating diffusion node FD2, and the second floating diffusion node FD2 may be connected to the third floating diffusion node FD3. The photocharges accumulated in the first capacitor C1 connected to the first floating diffusion node FD1 and the photocharges accumulated in the second capacitor C2 connected to the second floating diffusion node FD2 may move to the third floating diffusion node FD3. Also, a portion of the photocharges generated by the photodiode PD may move to the third floating diffusion node FD3. A portion of the photocharges accumulated in the first capacitor C1, the photocharges accumulated in the second capacitor C2, and some of the photocharges generated by the photodiode PD may be accumulated in the third capacitor C3. The pixel PX may operate in the ULCG mode.

According to various example embodiments, because the charges generated by the photodiode PD may or may appropriately move to the first to third capacitors C1, C2, and C3 connected to the first to third floating diffusion nodes FD1, FD2, and FD3, image data having a wide dynamic range and/or an improved SNR may be generated.

Figure 6:
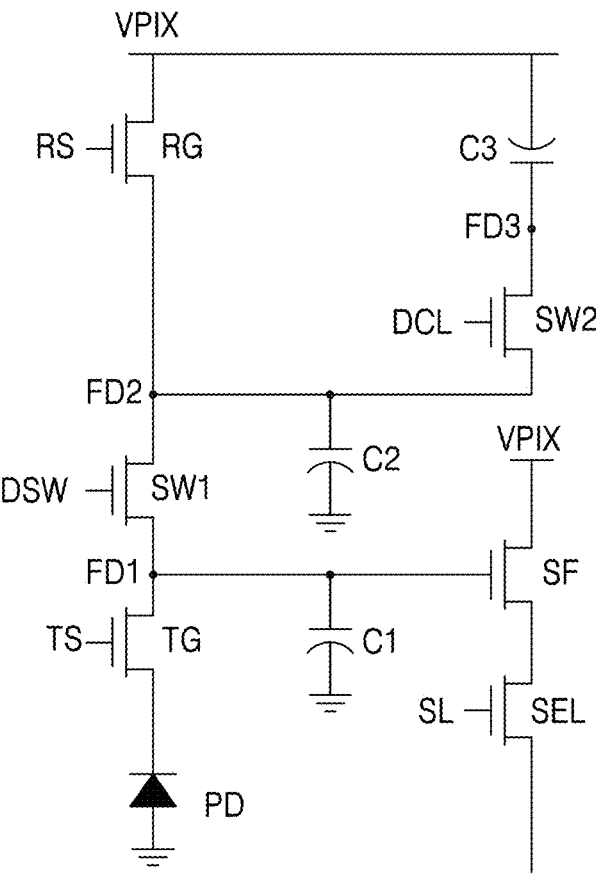
FIG. 6 is a circuit diagram of a pixel according to another embodiment.

FIG. 6 is a circuit diagram of a pixel according to another embodiment. In detail, FIG. 6 is a circuit diagram of the pixel PX of FIG. 1 according to various example embodiments. The same descriptions as given with reference to FIG. 2 are omitted.

Referring to FIGS. 1 and 6, the pixel PX may include a photodiode PD, a plurality of transistors, e.g., a first switch transistor SW1, a second switch transistor SW2, a reset transistor RG, a source follower transistor SF, and a selection transistor SEL, and a first capacitor C1, a second capacitor C2, and a third capacitor C3. Control signals, such as a transfer control signal TS, a first switch control signal DSW, a second switch control signal DCL, a reset control signal RS, and a selection signal SL, may be applied to the pixel PX, and at least some of the control signals may be generated by the row driver 120.

One end of the second switch transistor SW2 may be connected to the second floating diffusion node FD2 and another end thereof may be connected to the third capacitor C3. The second switch transistor SW2 may be turned on or off in response to the second switch control signal DCL received from the row driver 120.

One end of the second capacitor C2 may be connected to the second floating diffusion node FD2 and another end thereof may be connected to the second switch transistor SW2. When the first switch transistor SW1 is turned on, the first floating diffusion node FD1 may be connected to the second floating diffusion node FD2. Accordingly, a total capacitance of the first floating diffusion node FD1 connected to the gate terminal of the source follower transistor SF may increase by the sum of the capacitance of the first capacitor C1 and the capacitance of the second capacitor C2, and the pixel may output an output voltage of LCG.

According to various example embodiments, charges from the photodiode PD may overflow due to an exposure operation in a high-illuminance situation, and the over-flowed charges may be accumulated in the first capacitor C1 and the second capacitor C2. The overflowed charge may be accumulated in the first capacitor C1 and the second capacitor C2 even when the transfer transistor TG is turned off.

One end of the third capacitor C3 may be connected to the second switch transistor SW2 at the third floating diffusion node FD3. A pixel voltage VPIX may be applied to the third capacitor C3. However, inventive concepts is not limited thereto, and a voltage, other than the pixel voltage VPIX, e.g., a ground voltage, may be applied to another end of the third capacitor C3. When the second switch transistor SW2 is turned on, the second floating diffusion node FD2 may be connected to the third floating diffusion node FD3. When the first switch transistor SW1 is turned on, total capacitance of the first floating diffusion node FD1 connected to the gate terminal of the source follower transistor SF may increase by the sum of capacitance of the first capacitor C1, capacitance of the second capacitor C2, and capacitance of the third capacitor C3. Accordingly, the pixel may output an output voltage corresponding to the ULCG.

According to various example embodiments, the charges from the photodiode PD may overflow due to an exposure operation in a high-illuminance situation, and the over-flowed charges may be accumulated in the first capacitor C1, the second capacitor C2, and the third capacitor C3. A portion of the overflowed charges and the reset charge amount may be stored in the third capacitor C3. For example, the overflowed charges may be accumulated in the first capacitor C1, the second capacitor C2, and the third capacitor C3 even when the transfer transistor TG is turned off. Capacitance of the first capacitor C1 may be less than that of the second capacitor C2. The capacitance of the second capacitor C2 may be less than that of the third capacitor C3. For example, the capacitance of the third capacitor C3 may be greater than that of the second capacitor C2, and the capacitance of the second capacitor C2 may be greater than the capacitance of the first capacitor C1.

The reset transistor RG may reset charges accumulated in at least one of the first to third floating diffusion nodes FD1, FD2, and FD3. The pixel voltage VPIX may be applied to one end of the reset transistor RG, and the other end thereof may be connected to the second floating diffusion node FD2.

However, inventive concepts are not limited thereto, and a voltage, other than the pixel voltage VPIX, may be applied to the reset transistor RG. The reset transistor RG may be turned on or off in response to the reset control signal RS received from the row driver 120. Accordingly, charges accumulated in at least one of the first to third floating diffusion nodes FD1, FD2, and FD3 may be discharged so that at least one of the first to third floating diffusion nodes FD1, FD2, and FD3 may be reset.

According to various example embodiments, pixel signals respectively corresponding to conversion gain modes may be generated by accumulating charges generated in the photodiode PD using the first to third floating diffusion nodes FD1, FD2, and FD3 and the first to third capacitors C1, C2, and C3. Accordingly, the image sensor may generate image data having a wide dynamic range and an improved SNR.

Figure 7:
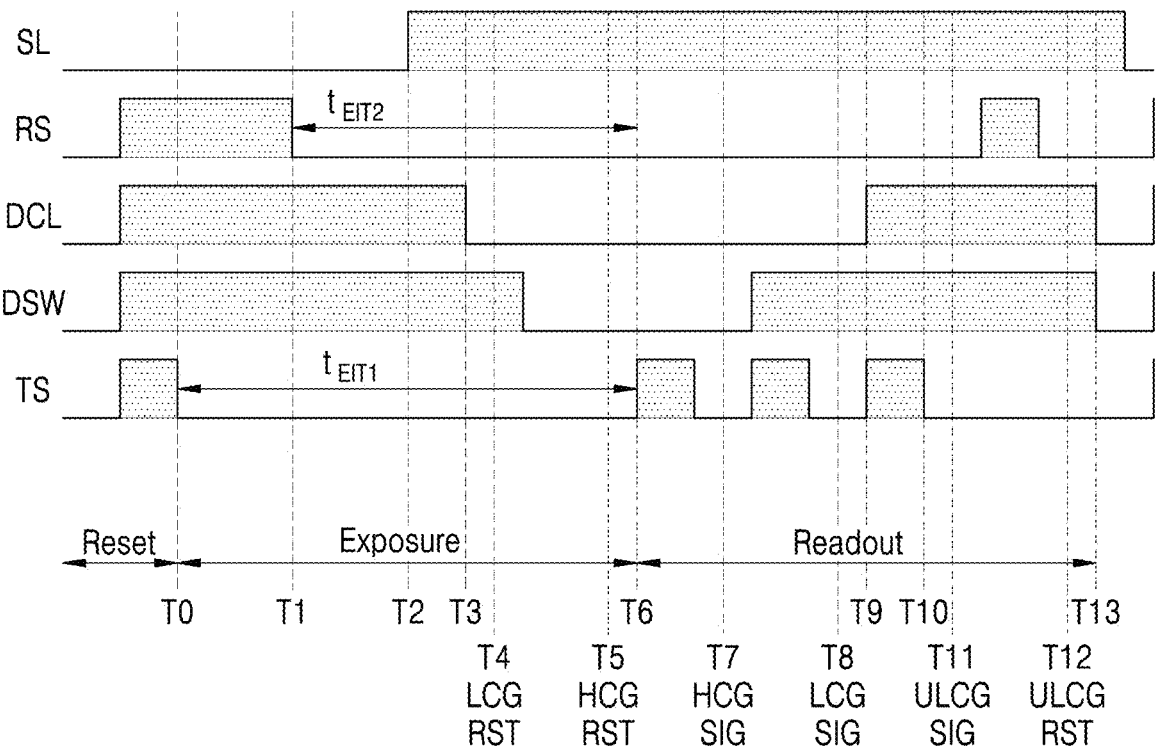
FIG. 7 is a timing diagram illustrating an operation of a pixel according to another embodiment.

FIG. 7 is a timing diagram illustrating an operation of a pixel according to another embodiment. In detail, FIG. 7 is a timing diagram illustrating an operation of the pixel PX of FIG. 6 according to various example embodiments.

Referring to FIGS. 6 and 7, the pixel PX may reset the first to third floating diffusion nodes FD1, FD2, and FD3 during a reset period, and the photodiode PD may receive an optical signal to generate and accumulate photocharges during an exposure period. During the readout period, pixel signals may be read out from the photodiode PD. Hereinafter, operations performed during the reset period, exposure period, and readout period are described.

A difference between FIG. 7 and FIG. 4 is a difference between turn-on and turn-off of the second switch control signal DCL from the first time point T0 to the second time point T1 of the exposure period.

First, during the reset period, the selection signal SL may maintain a first level (e.g., logic low). The reset control signal RS, the transfer control signal TS, the first switch control signal DSW, and the second switch control signal DCL may transition from a first level to a second level (e.g., logic high). Accordingly, the reset transistor RG, the transfer transistor TG, the first switch transistor SW1, and the second switch transistor SW2 may be turned on. That is, during the reset period, the pixel voltage VPIX may be applied to reset the photodiode PD, the first to third floating diffusion nodes FD1, FD2, and FD3, and the first to third capacitors C1, C2, and C3 connected thereto.

During the exposure period, at the first time point T0, the transfer control signal TS may transition from the second level to the first level, and the reset control signal RS, the first switch control signal DSW, and the second switch control signal DCL may maintain the second level. Accordingly, the transfer transistor TG may be turned off, and the reset transistor RG, the first switch transistor SW1, and the second switch transistor SW2 may remain turned on.

At the first time point T0, the photodiode PD may generate and accumulate photocharges according to a received optical signal, and a reset charge amount corresponding to voltages of the first floating diffusion node FD1 which is reset and the second floating diffusion node FD2 which is reset may be accumulated in the first capacitor C1, the second capacitor C2, and the third capacitor C3.

The time from the first time point T0 of the exposure period to a first time point T6 of the readout period at which the transfer transistor TG is turned off, during which the first level is maintained, may be referred to as a first EIT $t_{EIT1}$. The photodiode PD of the pixel PX may generate pho-tocharges during the first EIT $t_{EIT1}$ and may integrate (accu-mulate) the photocharges. When the generated photocharges exceed the maximum accumulation charge capacity of the photodiode PD, the overflowed charge may be accumulated in the first capacitor C1 of the first floating diffusion node FD1 and the second capacitor C2 of the second floating diffusion node FD2 through the first switch SW1, even when the transfer transistor TG is turned off.

Also, at the second time point T1 of the exposure period, the reset control signal RS may transition from the second level to the first level, and the first switch control signal DSW and the second switch control signal DCL may be maintained at the second level, and the transfer control signal TS may be maintained at the first level. Accordingly, the first switch transistor SW1 and the second switch transistor SW2 may remain turned on. Accordingly, overflowed charges, exceeding the maximum accumulation charge capacity, generated by the photodiode PD may be transferred to and accumulated in the first capacitor C1, the second capacitor C2, and the third capacitor C3.

The time from the second time point T1 of the exposure period to the first time point T6 of the readout period at which the transfer transistor TG is turned off, during which the first level is maintained, may be referred to as a second EIT $t_{EIT2}$. The third capacitor C3 may integrate photocharges during the second EIT $t_{EIT2}$ In detail, during the second EIT $t_{EIT2}$, a portion of the overflowed charges generated by the photodiode PD may be accumulated in the third capacitor C3.

According to various example embodiments, by controlling the reset control signal RS and the second switch control signal DCL during the exposure period, the amount of charges overflowed to the third capacitor C3 may be adjusted by adjusting the second EIT $t_{EIT2}$.

For example, when the turn-on of the reset control signal RS is maintained for a long time, the second EIT $t_{EIT2}$ may be shortened, so that the third capacitor C3 may accumulate relatively less charges overflowed from the photodiode PD. Conversely, when the turn-on of the reset control signal RS is maintained for a short time, the second EIT $t_{EIT2}$ may be lengthened, so that the third capacitor C3 may accumulate a relatively large amount of charges overflowed from the photodiode PD.

Accordingly, by controlling the amount of charges overflowed to the third capacitor C3 by adjusting the second EIT $t_{EIT2}$, the image sensor of inventive concepts may generate image data having a wide dynamic range and an improved SNR.

At the third time point T2 of the exposure period, the selection signal SL may transition from the first level to the second level. Accordingly, the selection transistor SEL may be turned on. The selection signal SL may maintain the second level after transitioning to the second level.

At the fourth time point T3 of the exposure period, the second switch control signal DCL may transition from the second level to the first level. Accordingly, the second switch transistor SW2 may be turned off. As the second switch transistor SW2 is turned off, the second floating diffusion node FD2 may not be connected to the third floating diffusion node FD3. The period from the third time point T2 to the fourth time point T3 of the exposure period may be omitted for convenience.

At the fifth time point T4 of the exposure period, the reset control signal RS may maintain the first level, the first switch control signal DSW may maintain the second level, and the second switch control signal DCL may maintain the first level. Accordingly, the first switch transistor SW1 may remain turned on, and the second switch transistor SW2 and reset transistor RG may remain turned off. Because the first floating diffusion node FD1 may be connected to the second floating diffusion node FD2 and the second floating diffusion node FD2 is not connected to the third floating diffusion node FD3, the pixel PX may operate in the LCG mode. Also, the reset signal LCG RST corresponding to the LCG mode may be output through the column line CL.

For example, referring to FIG. 7, the pixel signal output at the second time point T2 may be the reset signal LCG RST of the LCG mode of the photodiode PD. Because the selection control signal SL is at the second level, the selection transistor SEL may be turned on so that the reset signal LCG RST of the LCG mode of the photodiode PD may be output through the selection transistor SEL.

At the sixth time point T5 of the exposure period, the reset control signal RS and the second switch control signal DCL may maintain the first level. However, the first switch control signal DSW may transition from the second level to the first level. Accordingly, the first switch transistor SW1 may be turned off, and the reset transistor RG and the second switch transistor SW2 may remain turned off. Because the first floating diffusion node FD1 is not connected to the second floating diffusion node FD2, the pixel PX may operate in the HCG mode. Also, the reset signal HCG RST corresponding to the HCG mode may be output through the column line CL. That is, referring to FIG. 4, the pixel signal output at the fourth time point T3 may be a reset signal of the HCG mode of the photodiode PD. Because the selection control signal SL is at the second level, the selection transistor SEL is turned on so that the reset signal HCG RST of the HCG mode of the photodiode PD may be output through the selection transistor SEL.

Figure 8:
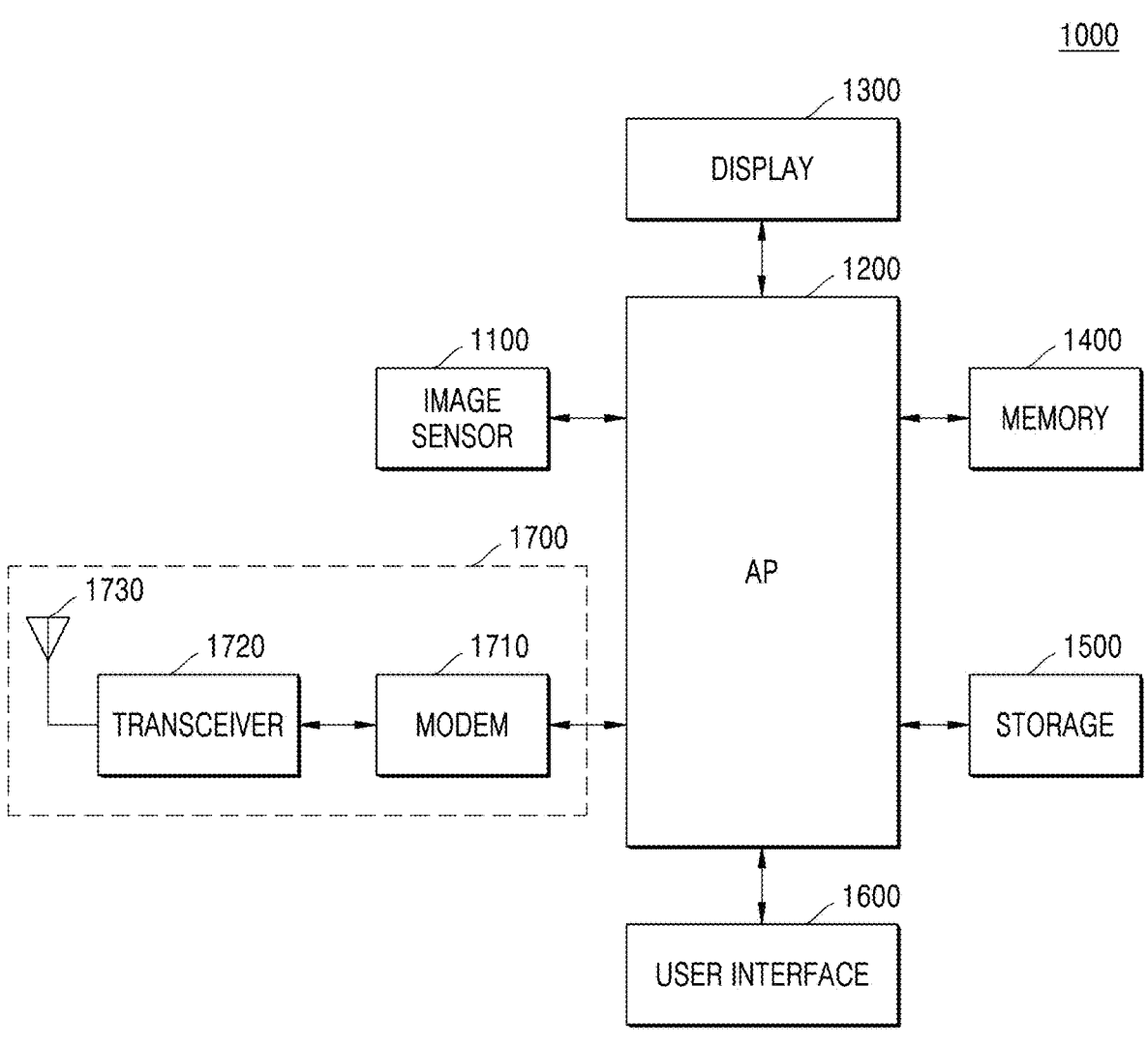
FIG. 8 is a block diagram illustrating an electronic device according to various example embodiments.

FIG. 8 is a block diagram illustrating an electronic device 1000 according to various example embodiments.

Referring to FIG. 8, the electronic device 1000 may include an image sensor 1100, an application processor (AP) 1200, a display 1300, a memory 1400, a storage 1500, a user interface 1600, and a wireless transceiver unit 1700. The image sensor 1100 of FIG. 8 may correspond to the image sensor 100 of FIG. 1. A redundant description which is the same as the description above with reference FIG. 1 will be omitted.

The AP 1200 may be provided as a system-on-chip (SoC) that controls an overall operation of the electronic device 1000 and drives an application program, an operating system, and the like. The AP 1200 may receive image data from the image sensor 1100 and may perform image processing on the received image data. In some example embodiments, the AP 1200 may store the received image data and/or processed image data in the memory 1400 or the storage 1500.

The memory 1400 may store programs and/or data processed and/or executed by the AP 1200. The storage 1500 may be implemented as a nonvolatile memory device such as a NAND flash or a resistive memory. For example, the storage 1500 may be provided as a memory card (MMC, eMMC, SD, micro SD) or the like. The storage 1500 may store data and/or programs for execution algorithms that control an image processing operation of the AP 1200, and the data and/or programs may be loaded into the memory 1400 when the image processing operation is performed.

The user interface 1600 may be implemented as various devices capable of receiving a user input, such as one or more of a keyboard, a curtain key panel, a touch panel, a fingerprint sensor, and a microphone. The user interface 1600 may receive a user input and provide a signal corresponding to the received user input to the AP 1200. The wireless transceiver unit 1700 may include a modem 1710, a transceiver 1720, and an antenna 1730.

The image sensor 1100 may include a pixel array in which a plurality of pixels are arranged, and the pixels may generate pixel signals corresponding to respective conversion gain modes by accumulating charges generated by a photodiode PD using first to third floating diffusion nodes FD1, FD2, and FD3 and first to third capacitors C1, C2, and C3.

According to various example embodiments, the image sensor 1100 may adjust the amount of charges overflowed to the third capacitor C3 by adjusting a second EIT $t_{EIT2}$ by controlling a reset control signal RS and a second switch control signal DCL during an exposure period.

For example, when the turn-on of the reset control signal RS is maintained for a long time, the second EIT $t_{EIT2}$ may be shortened, so that the third capacitor C3 may accumulate relatively less charges overflowed from the photodiode PD. Conversely, when the turn-on of the reset control signal RS is maintained for a short time, the second EIT $t_{EIT2}$ may be lengthened, so that the third capacitor C3 may accumulate a relatively large amount of charges overflowed from the photodiode PD.

Accordingly, by controlling the amount of charges overflowed to the third capacitor C3 by adjusting the second EIT $t_{EIT2}$, the image sensor 1100 of inventive concepts may generate image data having a wide dynamic range and an improved SNR.

Figure 9:
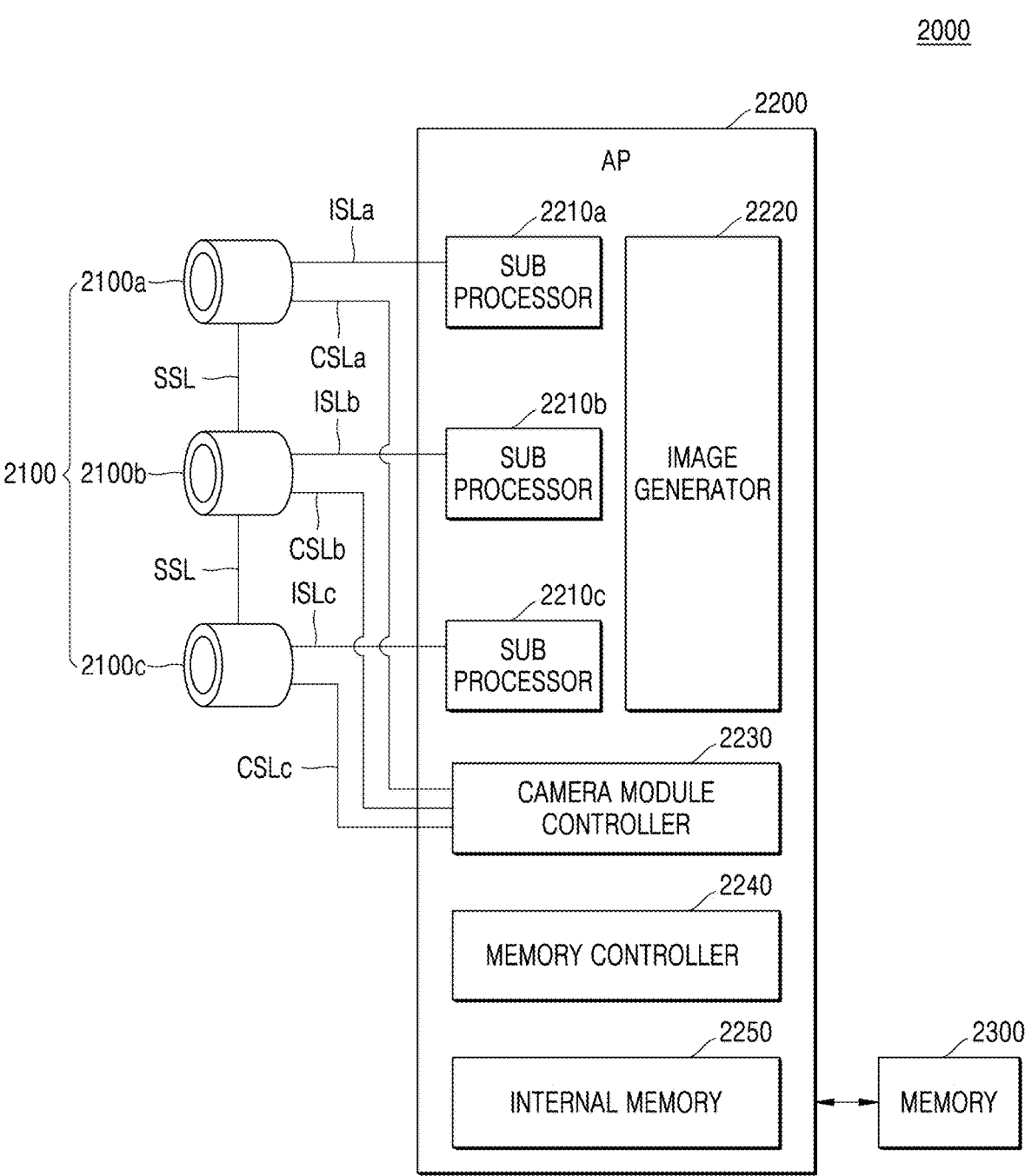
FIG. 9 is a block diagram illustrating part of an electronic device according to various example embodiments.
Figure 10:
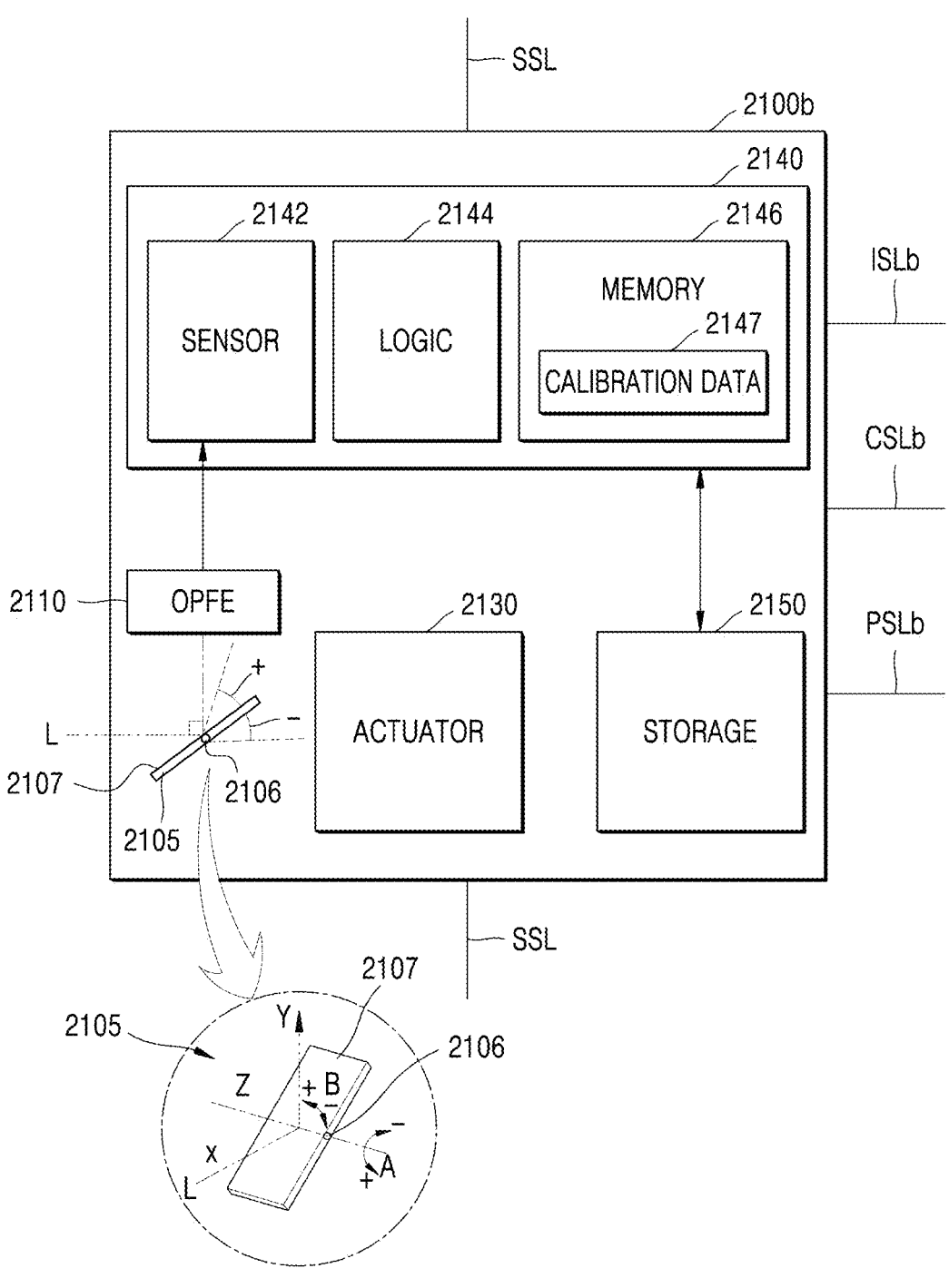
FIG. 10 is a block diagram illustrating a detailed configuration of a camera module according to various example embodiments.

FIG. 9 is a block diagram illustrating a part of an electronic device 2000 according to various example embodiments. FIG. 10 is a block diagram illustrating a detailed configuration of a camera module 2100*b* according to various example embodiments.

In detail, FIG. 9 is a diagram illustrating the electronic device 2000 as a portion of the electronic device 1000 of FIG. 8, and FIG. 10 is a diagram illustrating a detailed configuration of the camera module 2100*b* of FIG. 9.

Referring to FIG. 9, the electronic device 2000 may include a multi-camera module 2100, an AP 2200, and a memory 2300. The memory 2300 may perform the same function as that of the memory 1400 shown in FIG. 8, and thus redundant descriptions thereof are omitted.

The electronic device 2000 may capture and/or store an image of an object by using a complementary metal-oxide-semiconductor (CMOS) image sensor, and may be implemented as one or more of a mobile phone, a tablet computer, or a portable electronic device. The portable electronic device may include one or more of a laptop computer, a mobile phone, a smartphone, a tablet PC, a wearable device, etc.

The multi-camera module 2100 may include a first camera module 2100*a*, a second camera module 2100*b*, and a third camera module 2100*c*. The multi-camera module 2100 may include the image sensor 100 of FIG. 1. Meanwhile, in FIG. 9, it is illustrated that the multi-camera module 2100 includes three camera modules 2100*a*, 2100*b* and 2100*c*, but inventive concepts is not limited thereto, and various numbers of camera modules may be included in the multi-camera module 2100.

Hereinafter, a configuration of the camera module 2100*b* will be described in more detail with reference to FIG. 10, but the following description may be equally applied to other camera modules 2100*a* and 2100*c* according to various example embodiments.

Referring to FIG. 10, the second camera module 2100*b* may include a prism 2105, an optical path folding element (OPFE) 2110, an actuator 2130, an image sensing device 2140, and a storage 2150.

The prism 2105 may include a reflective surface 2107 of a light reflective material to change a path of light L incident from the outside.

According to various example embodiments, the prism 2105 may change the path of light L incident in a first direction X to a second direction Y perpendicular to the first direction X. In addition, the prism 2105 may rotate the reflective surface 2107 of the light reflective material in a direction A around a central axis 2106 or rotate the central axis 2106 in a direction B to change the path of light L incident in the first direction X to the second direction Y perpendicular thereto. At this time, the OPFE 2110 may also move in a third direction Z perpendicular to the first direction X and the second direction Y.

In various example embodiments, as illustrated, a maximum rotatable angle of the prism 2105 in the direction A may be less than or equal to 15 degrees in a positive (+) A direction and may be greater than 15 degrees in a negative (−) A direction, but the embodiments are not limited thereto.

In various example embodiments, the prism 2105 may move by around 20 degrees, between 10 degrees and 20 degrees, or between 15 degrees and 20 degrees in the positive (+) or negative (−) B direction, and the prism 2105 may move by the same angle or similar angles that are different from each other by around 1 degree in the positive (+) B direction and the negative (−) B direction.

In various example embodiments, the prism 2105 may move the reflective surface 2106 of the light reflective material in the third direction (e.g., the Z direction) parallel to an extension direction of the central axis 2106.

The OPFE 2110 may include, for example, a group of m optical lenses (here, m is a natural number). The m optical lenses may move in the second direction Y to change an optical zoom ratio of the camera module 2100*b*. For example, assuming that a basic optical zoom ratio of the camera module 2100*b* is Z, when m optical lenses included in the OPFE 2110 are moved, the optical zoom ratio of the camera module 2100*b* may be changed to an optical zoom ratio of 3Z, 5Z, or higher.

The actuator 2130 may move the OPFE 2110 or the optical lens to a certain position. For example, the actuator 2130 may adjust a position of the optical lens so that the image sensor 2142 is located at a focal length of the optical lens for accurate sensing.

The image sensing device 2140 may include an image sensor 2142, a logic 2144, a memory 2146, and a calibration data 2147. The image sensor 2142 may sense an image of a sensing target using light L provided through the optical lens. Because the image sensor 2142 of FIG. 10 may be functionally similar to the image sensor 110 of FIG. 1, redundant descriptions are omitted.

The logic 2144 may control overall operations of the second camera module 2100*b*. For example, the logic 2144 may control the operation of the second camera module 2100*b* according to a control signal provided through the control signal line CSLb.

The memory 2146 may store information necessary for the operation of the second camera module 2100*b*, such as calibration data 2147. The calibration data 2147 may include information necessary for the second camera module 2100*b* to generate image data using light L provided from the outside. The calibration data 2147 may include, for example, information on the degree of rotation, information on a focal length, information on an optical axis, and the like, as described above. When the second camera module 2100b is implemented in the form of a multi-state camera having a focal length changing according to a position of the optical lens, the calibration data 2147 may include a focal length value of each position (or state) of the optical lens and information related to auto-focusing.

The memory 2150 may store the image data sensed through the image sensor 2142. The memory 2150 may be located outside the image sensing device 2140 and may be implemented in a stacked form with a sensor chip constituting the image sensing device 2140. In various example embodiments, the memory 2150 may be implemented as an electrically erasable programmable read-only memory (EEPROM), but the embodiments are not limited thereto.

Referring to FIGS. 9 and 10 together, in various example embodiments, one camera module (e.g., the first camera module 2100a), among the camera modules 2100a, 2100b, and 2100c, may include four adjacent pixels (i.e., TETRA cells) sharing four pieces of the same color information in one color filter, and another camera module (e.g., the second camera module 2100b) may include adjacent pixels (i.e., NONA cells) sharing nine pieces of the same color information in one color filter, but the embodiments are not limited thereto.

In various example embodiments, each of the camera modules 2100a, 2100b, and 2100c may include the actuator 2130. Accordingly, each of the camera modules 2100a, 2100b, and 2100c may include the same or different calibration data 2147 according to the operation of the actuator 2130 included therein.

In various example embodiments, one camera module (e.g., the second camera module 2100b), among the camera modules 2100a, 2100b, and 2100c, may include a camera module in the form of a folded lens including the prism 2105 and the OPFE 2110 described above, and the other camera modules (e.g., 2100a and 2100b) may include vertical type camera modules that do not include the prism 2105 and the OPFE 2110, but the embodiments are not limited thereto.

In various example embodiments, one camera module (e.g., the third camera module 2100c), among the camera modules 2100a, 2100b, and 2100c, may include a vertical type depth camera extracting depth information using an infrared ray (IR). In this case, the AP 2200 may generate a 3D depth image by merging image data provided from the depth camera with image data provided from another camera module (e.g., the first camera module 2100a or the second camera module 2100b).

In various example embodiments, at least two camera modules (e.g., the first camera module 2100a or the second camera module 2100b), among the camera modules 2100a, 2100b, and 2100c, may have different fields of view (FOV). In this case, the optical lenses of at least two camera modules (e.g., the first camera module 2100a or the second camera module 2100b), among the camera modules 2100a, 2100b, and 2100c, may be different, but the embodiment is not limited thereto. For example, the FOV of the first camera module 2100a, among the camera modules 2100a, 2100b, and 2100c, may be less than those of the second and third camera modules 2100b and 2100c. However, the embodiment is not limited thereto, and the multi-camera module 2100 may further include a camera module having an FOV greater than those of the originally used camera modules 2100a, 2100b, and 2100c.

Also, in some example embodiments, FOVs of the camera modules 2100a, 2100b, and 2100c may be different from each other. In this case, optical lenses respectively included in the camera modules 2100a, 2100b, and 2100c may also be different from each other, but are not limited thereto.

In some example embodiments, the camera modules 2100a, 2100b, and 2100c may be located physically separated from each other. That is, a sensing area of one image sensor 2142 is not divided and used by the camera modules 2100a, 2100b, and 2100c, but the independent image sensor 2142 may be located inside each of the camera modules 2100a, 2100b, and 2100c.

The AP 2200 may include a plurality of sub-processors 2210a, 2210b, and 2210c, a camera module controller 2230, a memory controller 2400, and an internal memory 250. The AP 2200 may be implemented separately from the camera modules 2100a, 2100b, and 2100c. For example, the AP 2200 and the camera modules 2100a, 2100b, and 2100c may be separately implemented as separate semiconductor chips.

Image data or compressed data generated by each of the camera modules 2100a, 2100b, and 2100c may be provided to the corresponding sub-processors 2210a, 2210b, and 2210c through separate image signal lines ISLa, ISLb, and ISLc, respectively. For example, image data or compressed data generated by the first camera module 2100a may be provided to the first sub-processor 2210a through the first image signal line ISLa, image data or compressed data generated by the second camera module 2100b may be provided to the second sub-processor 2210b through the second image signal line ISLb, and image data or compressed data generated by the third camera module 2100c may be provided to the third sub-processor 2210c through the third image signal line ISLc. Such image data transmission may be performed using, e.g., a camera serial interface (CSI) based on a mobile industry processor interface (MIPI), but embodiments are not limited thereto.

In various example embodiments, one sub-processor may be provided to correspond to a plurality of camera modules. For example, the first sub-processor 2210a and the third sub-processor 2210c may not be implemented separately from each other as illustrated, but may be integrated as one sub-processor, and image data or compressed data provided from the camera module 2100a and the camera module 2100c may be selected through a selection element (e.g., a multiplexer) and then provided to the integrated sub image processor.

The camera module controller 2230 may provide a control signal to each of the camera modules 2100a, 2100b, and 2100c. A control signals generated by the camera module controller 2230 may be provided to the corresponding camera modules 2100a, 2100b, and 2100c respectively through separate control signal lines CSLa, CSLb, and CSLc.

The image sensor 1100 may include a pixel array in which a plurality of pixels are arranged, and the pixels may generate pixel signals corresponding to respective conversion gain modes by accumulating charges generated by the photodiode PD using the first to third floating diffusion nodes FD1, FD2, and FD3 and first to third capacitors C1, C2, and C3. Accordingly, the image sensor may generate image data having a wide dynamic range and an improved SNR.

While inventive concepts have been particularly shown and described with reference to various example embodiments thereof, it will be understood that various changes in form and details may be made therein without departing from the spirit and scope of the following claims. Furthermore, example embodiments are not necessarily mutually exclusive with one another. For example, some example embodiments may include one or more features described with reference to one or more figures, and may also include one or more other features described with reference to one or more other figures.

What is claimed is:

1. An image sensor including a pixel array in which a plurality of pixels are arranged, wherein each of the plurality of pixels comprises:

a photodiode;

a transfer transistor connected between the photodiode and a first floating diffusion node;

a first switch transistor connected between the first floating diffusion node and a second floating diffusion node;

a second switch transistor connected between the second floating diffusion node and a third floating diffusion node;

a first capacitor connected to the second floating diffusion node;

a second capacitor connected to the third floating diffusion node; and a reset transistor having one end connected to the third floating diffusion node and another end to which a pixel voltage is applied, wherein, the reset transistor is configured to turn on in a first period of an exposure period of the photodiode and to turn off in a second period of the exposure period, the first switch transistor is configured to turn on in the first period and the second period of the exposure period, and the second switch transistor is configured to turn off in the first period of the exposure period and to turn on in the second period of the exposure period.

2. The image sensor of claim 1, wherein the image sensor comprises:

a row driver configured to provide a select signal to the pixel array; and a readout circuit configured to readout pixel signals output from pixels of a row line selected by the row driver.

3. The image sensor of claim 1, wherein the first switch transistor is configured to turn off in a first period of a readout period of the photodiode, in which each pixel operates in a high conversion gain (HCG) mode, and is configured to turn on in a second period of the readout period of the photodiode, in which each pixel operates in a low conversion gain (LCG) mode.

4. The image sensor of claim 3, wherein the second switch transistor is configured to turn off in the first period and the second period of the readout period of the photodiode, and is configured to turn on in a third period of the readout period of the photodiode, in which each pixel operates in an ultra low conversion gain (ULCG) mode.

5. The image sensor of claim 4, wherein, in the third period of the readout period of the photodiode, the first switch transistor is configured to turn on.

6. The image sensor of claim 1, wherein the transfer transistor, the reset transistor, the first switch transistor, and the second switch transistor are configured to turn on in a reset period before the exposure period.

7. The image sensor of claim 1, wherein a capacitance of the first floating diffusion node is less than a capacitance of the first capacitor.

8. The image sensor of claim 7, wherein the capacitance of the first capacitor is less than a capacitance of the second capacitor.

9. The image sensor of claim 2, wherein the readout circuit is configured to generate image data based on first pixel signals read out in a first period of a readout period, second pixel signals read out in a second period of the readout period, and third pixel signals read out in a third period of the readout period.

10. The image sensor of claim 9, wherein the first pixel signals correspond to a first illuminance range, the second pixel signals correspond to a second illuminance range that is higher than the first illuminance range, and the third pixel signals correspond to a third illuminance range that is higher than the second illuminance range.

11. An image sensor comprising:

a pixel array in which a plurality of pixels are arranged;

a row driver configured to provide a select signal to the pixel array; and a readout circuit configured to read out pixel signals output from pixels of a row line selected by the row driver, wherein each of the plurality of pixels comprises:

a photodiode;

a transfer transistor connected between the photodiode and a first floating diffusion node;

a first switch transistor connected between the first floating diffusion node and a second floating diffusion node;

a second switch transistor connected to the second floating diffusion node and a third floating diffusion node;

a first capacitor connected to the second floating diffusion node;

a second capacitor connected to the third floating diffusion node;

a reset transistor having one end connected to the second floating diffusion node and another end to which a pixel voltage is configured to be applied;

a source follower transistor having one end connected to the first floating diffusion node and another end to which the pixel voltage is configured to be applied; and a selection transistor having one end connected to the source follower transistor, wherein, the reset transistor is configured to turn on in a first period of an exposure period of the photodiode and to turn off in a second period of the exposure period, the first switch transistor is configured to turn on in the first period and the second period of the exposure period, and the second switch transistor is configured to turn on in the first period and the second period of the exposure period.

12. The image sensor of claim 11, wherein the first switch transistor is configured to turn off in a first period of a readout period of the photodiode, in which each pixel operates in a high conversion gain (HCG) mode, and to turn on in a second period of the readout period of the photodiode, in which each pixel operates in a low conversion gain (LCG) mode.

13. The image sensor of claim 12, wherein the second switch transistor is configured to turn off in the first period and the second period of the readout period of the photodiode, and to turn on in a third period of the readout period of the photodiode, in which each pixel operates in an ultra low conversion gain (ULCG) mode.

14. The image sensor of claim 13, wherein the readout circuit is configured to generate image data based on first pixel signals read out in the first period of a readout period, second pixel signals read out in the second period of a readout period, and third pixel signals read out in the third period of the readout period.

15. The image sensor of claim 14, wherein
the first pixel signals correspond to a first illuminance range,
the second pixel signals correspond to a second illuminance range that is higher than the first illuminance range, and
the third pixel signals correspond to a third illuminance range that is higher than the second illuminance range.

16. The image sensor of claim 11, wherein a capacitance of the first floating diffusion node is less than a capacitance of the first capacitor, and the capacitance of the first capacitor is less than a capacitance of the second capacitor.

17. The image sensor of claim 11, wherein at least one of the first capacitor, and the second capacitor comprise cylindrical or metal-insulator-metal capacitors.

18. An image sensor including a pixel array in which a plurality of pixels are arranged and a readout circuit, wherein
each of the plurality of pixels comprises:
a photodiode;
a transfer transistor connected between the photodiode and a first floating diffusion node;
a first switch transistor connected between the first floating diffusion node and a second floating diffusion node;
a second switch transistor connected between the second floating diffusion node and a third floating diffusion node;
a first capacitor connected to the second floating diffusion node;
a second capacitor connected to the third floating diffusion node; and
a reset transistor having one end connected to the third floating diffusion node and another end to which a pixel voltage is applied,
wherein the first switch transistor is configured to turn off in a first period of a readout period of the photodiode, in which each pixel operates in a high conversion gain (HCG) mode, and to turn on in a second period of the readout period of the photodiode, in which each pixel operates in a low conversion gain (LCG) mode,
the second switch transistor is configured to turn on in a third period of the readout period of the photodiode, in which each pixel operates in an ultra low conversion gain (ULCG) mode, and is configured to turn off in a first period of an exposure period of the photodiode and to turn on in a second period of the exposure period of the photodiode, and
the reset transistor is configured to turn on in the first period of the exposure period and to turn off in the second period of the exposure period of the photodiode.

19. The image sensor of claim 18, wherein the readout circuit is configured to generate image data based on first pixel signals read out in the first period of the readout period, second pixel signals read out in the second period of the readout period, and third pixel signals read out in the third period of the readout period.

20. The image sensor of claim 19 wherein
the image sensor is configured to output, as a first pixel signal, a voltage corresponding to an amount of charge accumulated in the first floating diffusion node in the first period of the readout period,
to output, as a second pixel signal, a voltage corresponding to the amount of charge accumulated in the first floating diffusion node and the first capacitor in the second period of the readout period, and
to output, as a third pixel signal, a voltage corresponding to the amount of charge accumulated in the first floating diffusion node, the first capacitor, and the second capacitor in the third period of the readout period.

* * * * *